United States Patent
Bang et al.

(10) Patent No.: US 10,497,453 B2
(45) Date of Patent: Dec. 3, 2019

(54) MEMORY DEVICE

(71) Applicant: Samsung Electronics Co., Ltd., Suwon-si, Gyeonggi-do (KR)

(72) Inventors: Jin Bae Bang, Anyang-si (KR); Joon Suc Jang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/157,579

(22) Filed: Oct. 11, 2018

(65) Prior Publication Data
US 2019/0295671 A1   Sep. 26, 2019

(30) Foreign Application Priority Data
Mar. 26, 2018 (KR) .......... 10-2018-0034393

(51) Int. Cl.
*G11C 16/34* (2006.01)
*G11C 11/56* (2006.01)
*G11C 16/26* (2006.01)

(52) U.S. Cl.
CPC ...... *G11C 16/3495* (2013.01); *G11C 11/5642* (2013.01); *G11C 16/26* (2013.01)

(58) Field of Classification Search
CPC .......... G11C 16/26; G11C 29/24; G11C 7/227
USPC .............. 365/185.27, 185.17, 205
See application file for complete search history.

(56) References Cited

U.S. PATENT DOCUMENTS

| | | | |
|---|---|---|---|
| 8,773,922 B2 | 7/2014 | Song et al. | |
| 9,508,423 B2 | 11/2016 | Kim | |
| 2008/0266928 A1* | 10/2008 | Shinozaki | G11C 7/22 365/72 |
| 2012/0155186 A1 | 6/2012 | Chokan et al. | |
| 2013/0117635 A1 | 5/2013 | Ok et al. | |
| 2014/0380108 A1 | 12/2014 | Goldman et al. | |
| 2015/0049548 A1 | 2/2015 | Park et al. | |
| 2015/0287479 A1 | 10/2015 | Nam et al. | |
| 2017/0133087 A1 | 5/2017 | Park et al. | |
| 2017/0212693 A1 | 7/2017 | Sankaranarayanan et al. | |
| 2019/0180824 A1* | 6/2019 | Hsu | G11C 16/26 |

FOREIGN PATENT DOCUMENTS

| | | |
|---|---|---|
| JP | 2012-133840 A | 7/2012 |
| KR | 10-2011-0078727 A | 7/2011 |
| KR | 10-2015-0116351 A | 10/2015 |
| KR | 10-2017-0086173 A | 7/2017 |

* cited by examiner

*Primary Examiner* — Han Yang
(74) *Attorney, Agent, or Firm* — Harness, Dickey & Pierce, P.L.C.

(57) ABSTRACT

A memory device includes a page buffer unit including a plurality of latches latching each of a plurality of pieces of dummy data of selected memory cells according to a plurality of dummy signals provided by a word line of the selected memory cells, and a control logic comparing a count value of a first count latch among the plurality of latches with a reference count value, determining whether to count a second count latch other than the first count latch according to a result of the comparison, and correcting a level of a read signal provided by the word line of the selected memory cells in a read operation.

20 Claims, 17 Drawing Sheets

MEMORY DEVICE

CROSS-REFERENCE TO RELATED APPLICATION

This U.S. non-provisional application claims the benefit of priority under 35 U.S.C. § 119 to Korean Patent Application No. 10-2018-0034393 filed on Mar. 26, 2018 in the Korean Intellectual Property Office, the disclosure of which is incorporated herein by reference in its entirety.

BACKGROUND

1. Field

The present inventive concepts relate to a memory device.

2. Description of Related Art

A semiconductor memory device may be classified as a volatile semiconductor memory device or a non-volatile semiconductor memory device. A volatile semiconductor memory device may have relatively fast read and write speeds, but have a drawback in that stored contents may disappear when the power supply to the memory device is cut off. On the other hand, a non-volatile semiconductor memory device may preserve contents stored therein, even when the power supply to the memory device is cut off. Therefore, such a non-volatile semiconductor memory device may be used to store contents to be preserved, regardless of whether power is supplied to the memory device or not.

A representative example of a non-volatile memory device may be a flash memory device. Such a flash memory device is widely used as a voice and image data storage medium in a variety of information devices, such as computers, mobile phones, smartphones, PDAs, digital cameras, camcorders, voice recorders, MP3 players, personal digital assistants (PDAs), handheld computers, game machines, fax machines, scanners, printers, and the like. In recent years, high capacity, high-speed input/output, and low power consumption technologies of non-volatile memory devices have been actively researched to be applied to memory devices mounted in mobile devices such as smartphones.

In one or more of the present inventive concepts, a non-volatile memory device, a non-volatile memory device system, a data processing method thereof, and/or a non-transistory computer readable medium storing computer readable instructions for a data processing method for performing a data processing operation that may significantly reduce the occurrence of error bits in the device is disclosed.

SUMMARY

An aspect of at least one example embodiment of the present inventive concepts is to provide a memory device calculating a level of deterioration of memory cells based on a dummy read operation, and correcting a voltage level of a read signal based on the calculated level of deterioration.

According to an aspect of at least one example embodiment of the present inventive concepts, a memory device includes a page buffer unit including a plurality of latches, the plurality of latches configured to latch a plurality of pieces of dummy data of selected memory cells based on a plurality of dummy signals provided by a word line of the selected memory cells, the plurality of latches including a first count latch and a second count latch, the first count latch and the second count latch each configured to store a value corresponding to a number of on-cells or off-cells of respective ones of the selected memory cells, and a control logic configured to determine whether to count the second count latch based on a count value of the first count latch and a reference count value, and correct a voltage level of a read signal provided by the word line of the selected memory cells in a read operation based on results of the determination.

According to an aspect of at least one example embodiment of the present inventive concepts, a memory device may include a page buffer unit including a plurality of latches latching each of a plurality of pieces of dummy data of selected memory cells based on a plurality of dummy signals provided by a word line of the selected memory cells, a cell counter connected to the plurality of latches, the cell counter configured to count at least one of the pieces of dummy data, a control logic configured to detect a level of deterioration of the selected memory cells to correct a voltage level of a read signal, based on at least one count value output from the cell counter, and the cell counter is further configured to determine whether to update a piece of the dummy data selected as a count target, based on a level of deterioration of the pieces of dummy data selected as a count target.

According to an aspect of at least one example embodiment of the present inventive concepts, a memory device may perform a dummy read operation to provide a dummy voltage to a word line of selected memory cells, prior to a read operation providing a read voltage to the word line of the selected memory cells, the memory device may include a page buffer connected to a memory cell array including a plurality of memory cells, and the page buffer including a plurality of latches, a cell counter connected to the plurality of latches, the cell counter configured to count at least one of an on-cell or an off-cell of the memory cells, and a control logic configured to correct a voltage level of a read signal based on a count value output from the cell counter, in response to the dummy voltage, and change a potential of the word line to a desired voltage level of the read signal, after an end of a latch period corresponding to the plurality of latches latching data of the memory cells during the dummy read operation.

BRIEF DESCRIPTION OF DRAWINGS

The above and other aspects, features, and advantages of various example embodiments will be more clearly understood from the following detailed description, taken in conjunction with the accompanying drawings, in which.

DETAILED DESCRIPTION

Hereinafter, example embodiments of the present inventive concepts will be described with reference to the accompanying drawings.

Figure 1:
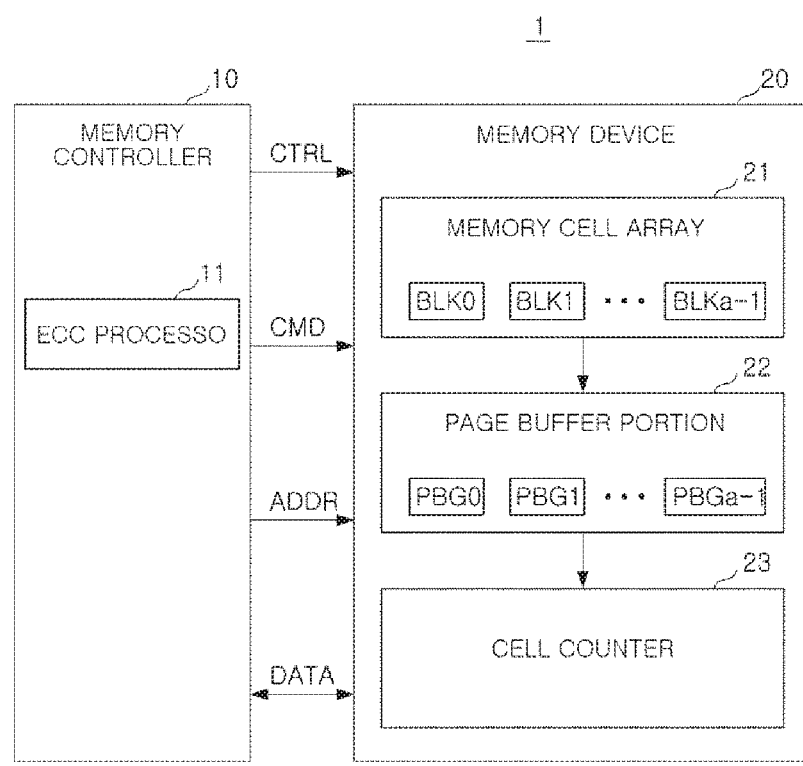
FIG. 1 is a block diagram schematically illustrating a memory system according to at least one example embodiment of the present inventive concepts.

FIG. 1 is a block diagram schematically illustrating a memory system according to at least one example embodiment of the present inventive concepts. Referring to FIG. 1, a memory system 1 may include a memory controller 10 and/or a memory device 20, but the example embodiments are not limited thereto and may include a greater or lesser number of constituent components.

The memory controller 10 may control the memory device 20. The memory controller 10 may control various operations, such as program, read, and erase operations, for the memory device 20 by providing an address ADDR, a command CMD, and/or a control signal CTRL to the memory device 20. The memory controller 10 may include an error correction circuit ECC processor 11. The ECC processor 11 may check and correct whether there is an error in data read from the memory device 20. The ECC processor 11 may compare a parity generated and stored when data is programmed with a parity generated when data is read, to detect an error bit of the data, and/or correct the detected error bit.

The memory device 20 may include a memory cell array 21, a page buffer unit 22, and/or a cell counter 23, but is not limited thereto.

The memory cell array 21 may include a plurality of memory blocks BLK0 to BLKa-1 (where a is an integer of 2 or more), and each of the memory blocks BLK0 to BLKa-1 may include a plurality of pages. The memory cell array 21 may be connected to a row decoder through word lines WLs, and selection lines SSLs and GSLs, and to the page buffer unit 22 through bit lines BLs. Each of the memory blocks BLK0 to BLKa-1 may include a plurality of memory cells arranged in regions where the plurality of word lines and the plurality of bit lines are disposed in an intersecting manner. The memory cells may be programmed, erased, and/or read by a voltage provided by the bit line BL and the word line WL. As an example, the memory cell array 21 may be a NAND flash memory cell array, a NOR flash memory cell array, etc. Hereinafter, various example embodiments of the present inventive concepts will be described in detail, assuming that the plurality of memory cells are flash memory cells, but the example embodiments are not limited thereto. According to at least one example embodiment, the plurality of memory cells may be resistive memory cells such as resistive RAM (RRAM), phase change RAM (PRAM), magnetic RAM (MRAM), etc., but are not limited thereto.

The page buffer unit 22 may store data to be written in the memory cell array 21 and/or data to be read from the memory cell array 21. The page buffer unit 22 may include a plurality of page buffer groups PB G0 to PBGa-1, and the plurality of page buffer groups PBG0 to PBGa-1 may include a plurality of page buffers. For example, the number of page buffer groups PBG0 to PBGa-1 may correspond to the number of memory blocks BLK0 to BLKa-1, and the number of the plurality of page buffers included in each of the page buffer groups PBG0 to PBGa-1 may correspond to the number of the plurality of bit lines included in each of the memory blocks BLK0 to BLKa-1.

When a read operation is performed on the memory device 20, the plurality of page buffers stores data of selected portion of memory cells among a plurality of memory cells included in the memory cell array 21, according to a read signal provided by the word line of the selected memory cells. In one example, each of the plurality of page buffers may include at least one latch, and a latching signal may be provided to the at least one latch to latch data of the memory cells, but the example embodiments are not limited thereto.

The cell counter 23 may count the number of memory cells from the data stored in the plurality of page buffers. In one example, the cell counter 23 may count off-cells and/or on-cells of memory cells from data stored in each of the page buffers, but the example embodiments are not limited thereto.

Figure 2:
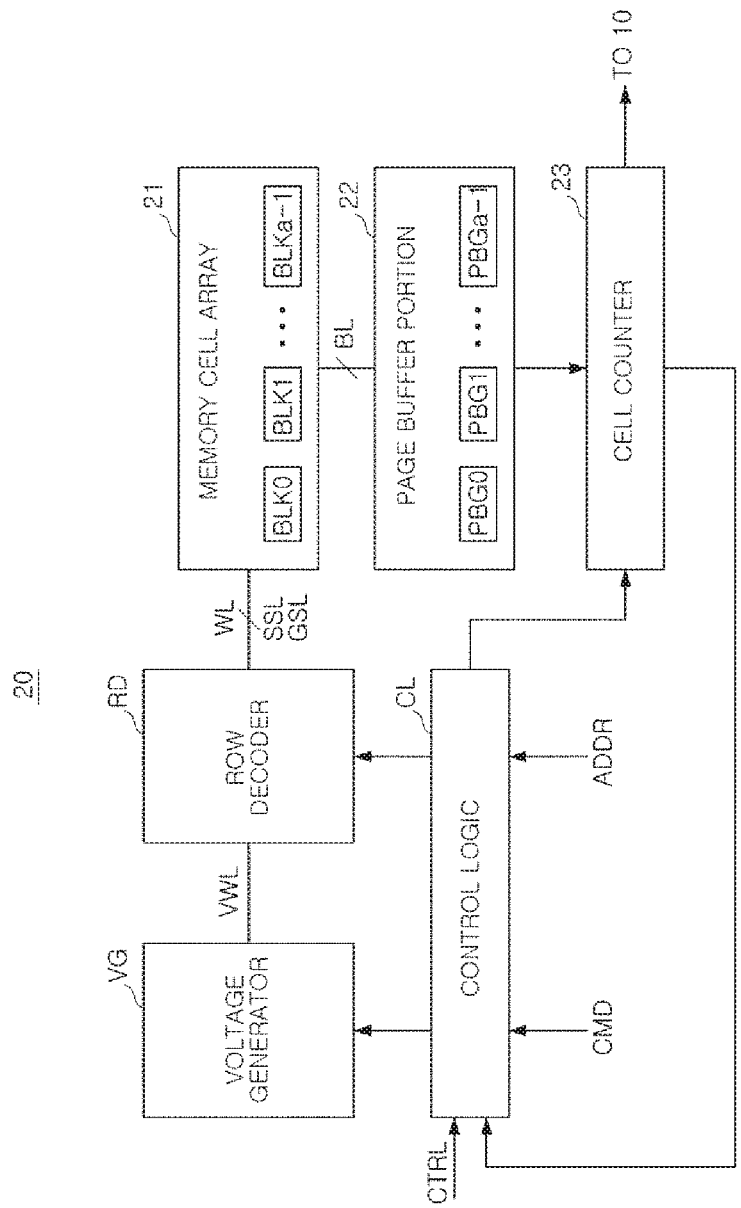
FIG. 2 is a block diagram illustrating in detail a memory device included in a memory system of FIG. 1 according to at least one example embodiment.

FIG. 2 is a block diagram illustrating in detail a memory device included in a memory system of FIG. 1 according to at least one example embodiment.

Referring to FIG. 2, a memory device 20 may include a memory cell array 21, a page buffer unit 22, a cell counter 23, a control logic CL, a voltage generator VG, and/or a row decoder RD, but the example embodiments are not limited thereto.

The control logic CL may output control signals for programming data to the memory cell array 21, and/or for reading data from the memory cell array 21, according to a command CMD, an address ADDR, and/or a control signal CTRL received from the memory controller 10. The control signals output from the control logic CL may be transferred to the voltage generator VG, the row decoder RD, the page buffer unit 22, and/or the cell counter 23, but is not limited thereto.

The voltage generator VG may generate a voltage of a word line VWL for driving a plurality of word lines WL, based on the control signal received from the control logic CL. The voltage of a word line VWL may include a program voltage, a read voltage, an erase voltage, and/or a pass voltage, etc.

The row decoder RD may select and activate a portion of the plurality of word lines WL based on the row address. The row decoder RD may transfer the voltage of a word line VWL corresponding to an operation mode of a word line of a selected memory block. In a program operation, the row decoder RD transfers a program voltage Vpgm and a program verification voltage Vpgm_fy to a selected word line, and/or transfers a program pass voltage Vpgm_pass to an unselected word line. In an erase operation, the row decoder RD transfers an erase voltage Vera and an erase verification voltage Vera_fy to a selected word line WL, and/or transfers an erase pass voltage Vera_pass to an unselected word line. In a read operation, the row decoder RD transfers a read voltage Vr to a selected word line, and/or transfers a read pass voltage Vr_pass to an unselected word line. In the above description, it is described that the read operation may be performed by providing the read voltage Vr. In a broad sense, the read operation of at least one example embodiment of the present inventive concepts may be performed by the program verification voltage Vpgm_fy in the program operation and/or the erase verification voltage Vera_pass in the erase operation, as well as by the read voltage Vr.

The page buffer unit 22 may include a plurality of page buffer groups PBG0 to PBGa-1, and each of the plurality of page buffer groups PBG0 to PBGa-1 may include a plurality of page buffers, but the example embodiments are not limited thereto. The plurality of page buffers may be connected to the memory cell array 21 through a plurality of bit lines BLs. During the read operation, the plurality of page buffers may operate as a sense amplifier, and output data stored in the memory cell array 21. In the program operation, the plurality of page buffers may operate as a writing driver to input data to be stored in the memory cell array 21. The cell counter 23 may count the number of memory cells from the data stored in the plurality of page buffers.

Figure 3:
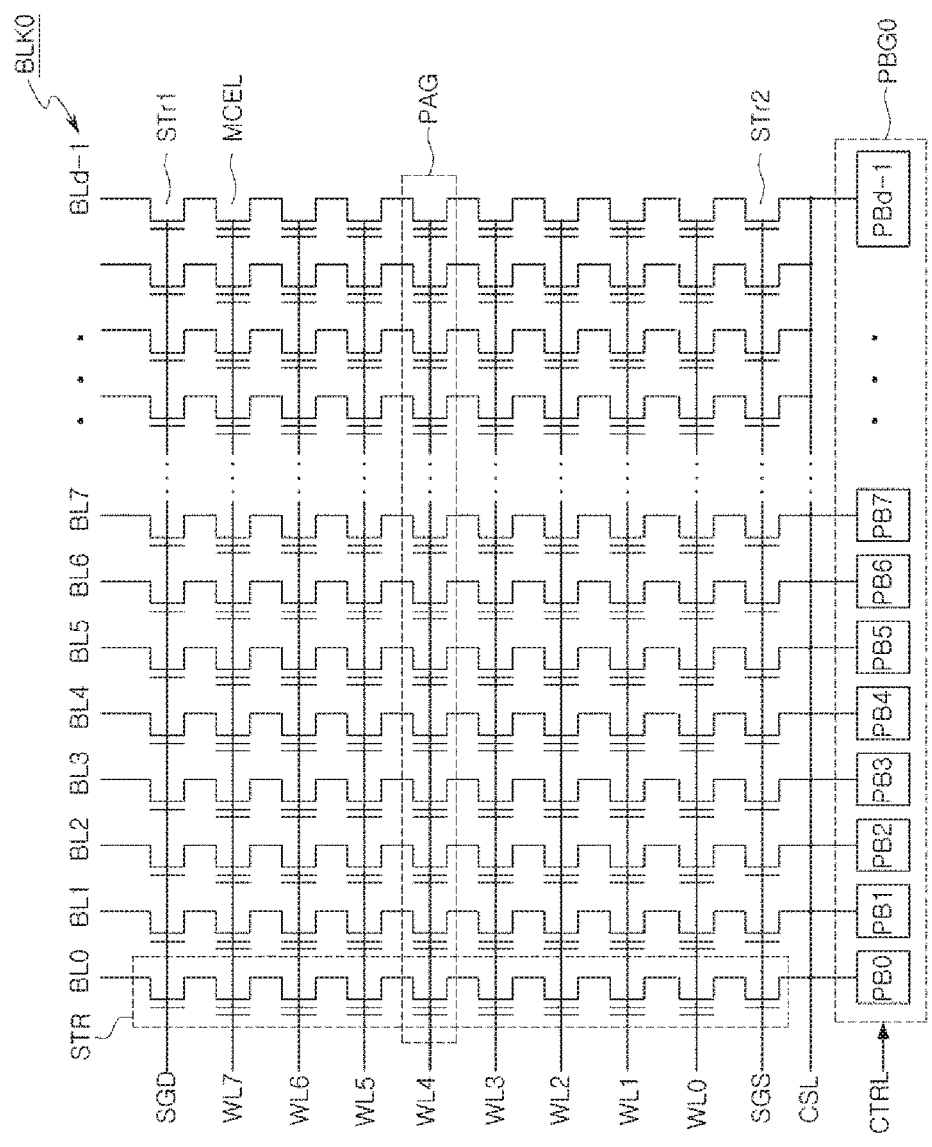
FIG. 3 is a block diagram illustrating an example configuration of a memory block and a page buffer group of FIG. 1 according to at least one example embodiment.

FIG. 3 is a block diagram illustrating an example configuration of a memory block and a page buffer group of FIG. 1 according to at least one example embodiment. Although FIG. 3 shows only structures of a memory block BLK0 and a page buffer group PBG0 for the sake of convenience of illustration, the memory block and the page buffer group structures are not limited thereto. Additionally, the other memory blocks BLK1 to BLKa-1 and other page buffer groups PBG1 to PBGa-1 may have the same structure or a different structure to the structure of the memory block BLK0 and the page buffer group PB G0.

The memory block BLK0 may include d strings STR in which 8 memory cells MCELs are connected in series in a bit line BL0 to BLd-1 direction (d may be an integer of 2 or more), but are not limited thereto. Each of the strings STR may include a drain selection transistor STr1 and a source selection transistor STr2 connected to both ends of the memory cells MCELs connected in series. Each of the gates in the drain selection transistors STr1 may be connected to a string selection line SGD. Then, each string STR may be connected to a common source line CSL through the source selection transistor STr2. Each of the gates in the source selection transistors STr2 may be connected to a ground selection line SGS.

The memory device having the same structure as shown in FIG. 3 may perform an erase operation on a block basis, and perform a program operation on a page PAG basis corresponding to each of word lines WL0 to WL7, but is not limited thereto. FIG. 3 shows an example in which 8 pages PAGs for 8 word lines WL0 to WL7 may be provided in a single memory block, but is not limited thereto. According to at least one example embodiment, the memory block BLK0 of the memory cell array 21 may have a different number of memory cells and pages than the number of the memory cells MCEL and pages PAGs shown in FIG. 3.

Page buffers PB0 to PBd-1 connected to the bit lines BL0 to BLd-1 of the memory block BLK0 may set up and/or precharge the bit lines BL0 to BLd-1 during the program operation. During the read operation, the page buffers PB0 to PBd-1 may precharge the bit lines BL0 to BLd-1 (Precharge), and sense whether the selected memory cell is turned on or off. The page buffers PB0 to PBd-1 may include transistors for supplying a power supply voltage to the bit line. The page buffers PB0 to PBd-1 may be supplied with a control signal CTRL for controlling the transistors from a control logic CL. The bit lines BL0 to BLd-1 may be precharged and developed by the control signal CTRL (Develop).

Figure 4:
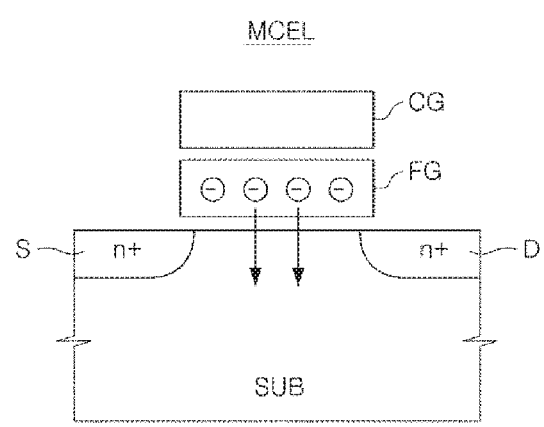
FIG. 4 is a cross-sectional view showing an example of a memory cell included in a memory block of FIG. 3 according to at least one example embodiment.

FIG. 4 is a cross-sectional view showing an example of a memory cell included in a memory block of FIG. 3 according to at least one example embodiment. Referring to a memory cell MCEL of FIG. 4, a source S and a drain D may be formed on a substrate SUB, and a channel region may be formed between the source S and the drain D. A floating gate FG may be formed on an upper portion of the channel region, and an insulation layer such as a tunneling insulation layer may be disposed between the channel region and the floating gate FG. A control gate CG may be formed on an upper portion of the floating gate FG, and an insulation layer such as a blocking insulation layer may be disposed between the floating gate FG and the control gate CG. Voltages required for program, erase and read operations for the memory cell MCEL may be applied to the substrate SUB, the source S, the drain D and/or the control gate CG. Data stored in the memory cell MCEL may be read by distinguishing a threshold voltage Vth of the memory cell MCEL. The threshold voltage Vth of the memory cell MCEL may be determined based on an amount of electrons stored in the floating gate FG. The more electrons stored in the floating gate FG, the higher the threshold voltage of the memory cell MCEL. The electrons stored in the floating gate FG of the memory cell MCEL may be leaked in an arrow direction for various reasons, and thus the threshold voltage of the memory cell MCEL may be changed. For example, the electrons stored in the floating gate FG may leak due to wear of the memory cell. Repetition of access operations, such as program, erase, and/or read operations, to the memory cell MCEL may cause an insulation film between the channel region and the floating gate FG to be worn out, thereby causing electrons stored in the floating gate FG to leak. As another example, electrons stored in the floating gate FG may leak due to a high temperature stress and/or a temperature difference at the time of program/read operation, etc.

Figure 5:
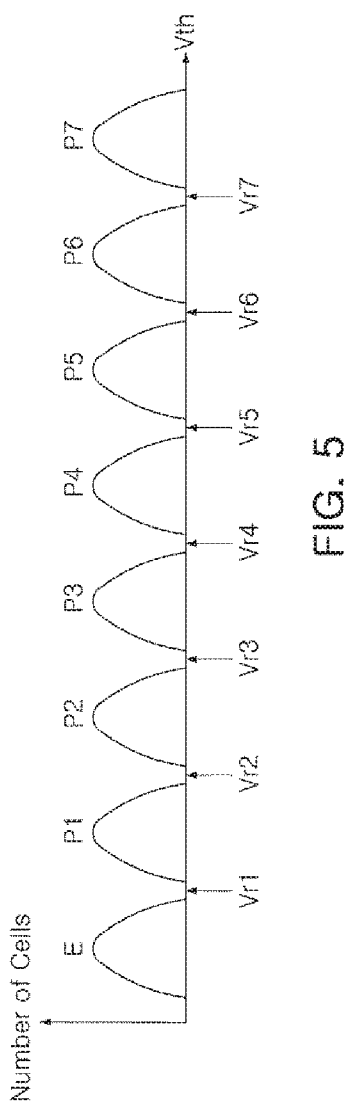
FIG. 5 is a graph illustrating a distribution according to a threshold voltage, in which a memory cell MCEL of FIG. 3 is a triple level cell TLC capable of storing 3 bits of data per cell according to at least one example embodiment.

FIG. 5 is a graph illustrating a distribution according to a threshold voltage, in which a memory cell MCEL of FIG. 3 is a triple level cell TLC capable of storing 3 bits of data per cell according to at least one example embodiment. An operation of the memory device will be described on the assumption that the memory cell may be a triple level cell TLC, but the example embodiments are not limited thereto. A method to be described later may be applied to a quadruple level cell QLC capable of storing 4 bits of data per cell, and a multi-level cell capable of storing 4 bits or more of data per cell.

Referring to FIG. 5, a horizontal axis may represent a threshold voltage Vth, and a vertical axis may represent the number of memory cells MCELs. When the memory cell MCEL is a 3-bit multi-level cell, the memory cell MCEL may have one of an erase state E, a plurality of program states, such as a first program state P1, a second program state P2, a third program state P3, a fourth program state P4, a fifth program state P5, a sixth program state P6, and/or a seventh program state P7, but is not limited thereto. In the case of a multi-level cell as compared with a single-level cell, since an interval between the threshold voltage Vth distributions may be narrow, a read reliability may be lowered by a small change in the threshold voltage Vth in the multi-level cell. A first read voltage Vr1 may have a voltage level between a distribution of the memory cell MCEL having the erase state E and a distribution of the memory cell MCEL having the first program state P1. A second read voltage Vr2 may have a voltage level between a distribution of the memory cell MCEL having the first program state P1 and a distribution of the memory cell MCEL having the second program state P2. A third read voltage Vr3 may have a voltage level between a distribution of the memory cell MCEL having the second program state P2 and a distribution of the memory cell MCEL having the third program state P3. A fourth read voltage Vr4 may have a voltage level between a distribution of the memory cell MCEL having the third program state P3 and a distribution of the memory cell MCEL having the fourth program state P4. A fifth read voltage Vr5 may have a voltage level between a distribution of the memory cell MCEL having the fourth program state P4 and a distribution of the memory cell MCEL having the fifth program state P5. A sixth read voltage Vr6 may have a voltage level between a distribution of the memory cell MCEL having the fifth program state P5 and a distribution of the memory cell MCEL having the sixth program state P6. A seventh read voltage Vr7 may have a voltage level between a distribution of the memory cell MCEL having the sixth program state P6 and a distribution of the memory cell MCEL having the seventh program state P7, etc.

When the first read voltage Vr1 is applied to the control gate CG of the memory cell MCEL, the memory cell MCEL of the erase state E may be turned on, while the memory cell MCEL of the first program state P1 may be turned off. When the memory cell MCEL is turned on, a current may flow through the memory cell MCEL. When the memory cell MCEL is turned off, no current may flow through the memory cell MCEL. Therefore, data stored in the memory cell MCEL may be distinguished, depending on whether the memory cell MCEL is turned on.

It may be distinguished that, when the first read voltage Vr1 is applied to turn on the memory cell MCEL, data '1' is stored (e.g., a voltage equivalent to a logical 1 value), while, when the memory cell MCEL is turned off, data '0' is stored (e.g., a voltage equivalent to a logical 0 value). It may also be distinguished that, when the first read voltage Vr1 is applied to turn on the memory cell MCEL, data '0' is stored, while, when the memory cell MCEL is turned off, data '1' is stored, depending on at least one example embodiment. As such, an allocation of logic levels of data may be changed, depending on at least one example embodiment.

Figure 6:
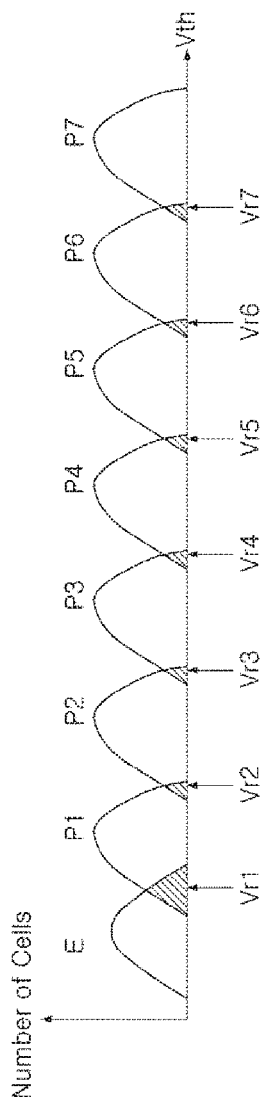
FIG. 6 is a graph illustrating a case in which a threshold voltage of a memory cell MCEL is changed in a graph of FIG. 5 according to at least one example embodiment.

FIG. 6 is a graph illustrating a case in which a threshold voltage of a memory cell MCEL is changed in a graph of FIG. 5 according to at least one example embodiment.

Referring to FIG. 6, memory cells MCELs programmed respectively in an erase state E and a plurality of program states, e.g., a first to seventh program states P1 to P7 (but is not limited thereto), may have a distribution changed by external stimuli and/or wear or the like as shown in FIG. 6. In FIG. 6, the memory cells MCEL belonging to a parallel diagonal line portion may cause a read error, and therefore, the reliability of the memory device 20 may deteriorate. For example, in a case that a read operation for the memory device 20 is performed using a first read voltage Vr1, the memory cells MCEL belonging to the parallel diagonal line portion may be programmed in a first program state P1, but may be determined as being in the erase state E by decreasing a threshold voltage Vth.

Figure 7:
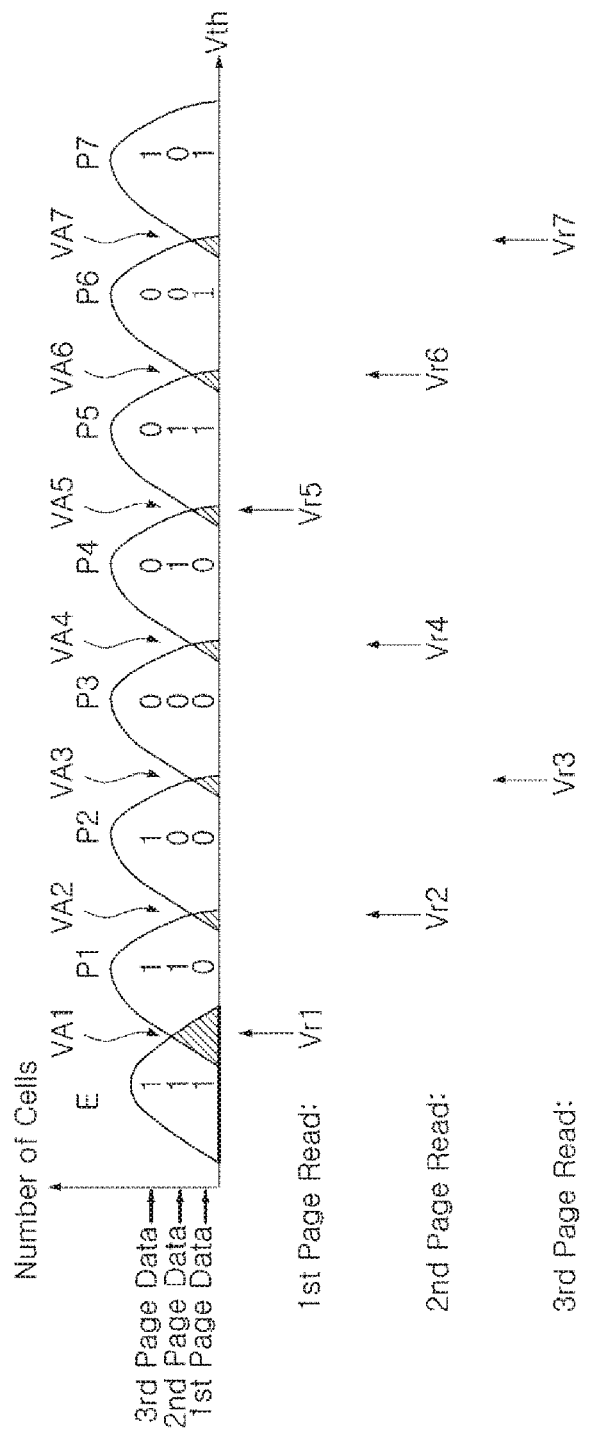
FIG. 7 is a graph illustrating a read operation per page, in which a memory cell is a 3-bit multi-level cell according to at least one example embodiment.

FIG. 7 is a graph illustrating a read operation per page, in which a memory cell is a 3-bit multi-level cell according to at least one example embodiment. A page of a 3-bit multi-level cell may include a plurality of bit pages, and may, for example, include a least significant bit LSB page, a center bit CSB page, and/or a most significant bit MSB page, but is not limited thereto.

Referring to FIG. 7, when the memory cell MCEL is a 3-bit multi-level cell, 8 pieces of status information of the memory cell MCEL, but is not limited thereto. For example, 8 page data may be output in a state divided into three bit pages. In at least one example embodiment, an erase state E may be allocated data 111, a first program state P1 may be allocated data 110, a second program state P2 may be allocated data 100, a third program state P3 may be allocated data '000,' a fourth program state P4 may be allocated data '010,' a fifth program state P5 may be allocated data '011,' a sixth program state P2 may be allocated data '001,' and a seventh program state P3 may be allocated data '101,' etc. However, according to at least one example embodiment, data allocated to each program state may be changed.

A read (e.g., 1st Page Read) operation of the first bit page corresponding to the least significant bit LSB page may be performed by reading a first valley VA1 between the erase state E and the first program state P1, and a fifth valley VA5 between the fourth program state P4 and the fifth program state P5. A read (e.g., 2nd Page Read) operation of the second bit page corresponding to the intermediate bit CSB page may be performed by reading a second valley VA2 between the first program state P1 and the second program state P2, a fourth valley VA4 between the third program state P3 and the fourth program state P4, and a sixth valley VA6 between the fifth program state P5 and the sixth program state P6. A read (e.g., 3rd Page Read) operation of the third bit page corresponding to the most significant bit MSB page may be performed by reading a third valley VA3 between the second program state P2 and the third program state P3, and a seventh valley VA7 between the sixth program state P6 and the seventh program state P7. However, the example embodiments are not limited thereto.

In the read (e.g., 1st Page Read) operation of the first bit page corresponding to the least significant bit LSB page, a first read voltage Vr1 may be provided to a word line of selected memory cells. A memory cell having a threshold voltage lower than the first read voltage Vr1 may be stored as a logical '1' value and a memory cell having a threshold voltage equal to or higher than the first read voltage Vr1 may be stored as a logical '0' value. Then, a fifth read voltage Vr5 may be provided to the word line of the selected memory cells. A memory cell having a threshold voltage lower than the fifth read voltage Vr5 may maintain the previously stored logical '0' value. A memory cell having a threshold voltage equal to or higher than the fifth read voltage Vr5 may be toggled from a previously stored logical '0' to a logical '1.' In the read (e.g., 1st Page Read) operation of the first bit page, two pieces of page data may be read, but is not limited thereto.

In the read (e.g., 2nd Page Read) operation of the second bit page corresponding to the center bit CSB page, a second read voltage Vr2 may be provided to a word line of selected memory cells. A memory cell having a threshold voltage lower than the second read voltage Vr2 may be stored as a logical '1' value, and a memory cell having a threshold voltage equal to or higher than the second read voltage Vr2 may be stored as a logical '0' value. Then, a fourth read voltage Vr4 may be provided to the word line of the selected memory cells. A memory cell having a threshold voltage lower than the fourth read voltage Vr4 may maintain the previously stored logical '0' Value. A memory cell having a threshold voltage equal to or higher than the fourth read voltage Vr4 may be toggled from a previously stored logical '0' value to a logical '1' value. Finally, a sixth read voltage Vr6 may be provided to the word line of the selected memory cells. A memory cell having a threshold voltage lower than the sixth read voltage Vr6 may maintain the previously stored logical value. A memory cell having a threshold voltage equal to or higher than the sixth read voltage Vr6 may be toggled to a logical '0' value. In the read (e.g., 2nd Page Read) operation of the second bit page, three pieces of page data may be read. However, the example embodiments are not limited thereto.

In the read (e.g., 3rd Page Read) operation of the third bit page corresponding to the MSB page, a third read voltage Vr3 may be provided to a word line of selected memory cells. A memory cell having a threshold voltage lower than the third read voltage Vr3 may be stored as a logical '1' value, and a sensing result of a memory cell having a threshold voltage equal to or higher than the third read voltage Vr3 may be stored as a logical '0' value. Then, a seventh read voltage Vr7 may be provided to a word line of the selected memory cells. The memory cell having a threshold voltage lower than the seventh read voltage Vr7 may maintain the previously stored logical '0' value. The memory cell having a threshold voltage equal to or higher than the seventh read voltage Vr7 may be toggled from the previously stored logical '0' value to a logical '1' value. In the read (e.g., 3rd Page Read) operation of the third bit page, three pieces of page data may be read. However, the example embodiments are not limited thereto.

Meanwhile, as previously described, In FIG. 7, when the read operation is performed using the first read voltage Vr1, the memory cells MCEL belonging to the parallel diagonal line portion may be programmed in the first program state P1, but the memory cells MCEL belonging to the parallel diagonal line portion may cause a read error, such as a voltage level of the read signal being determined as an erase state E due to a decrease of a threshold voltage Vth, etc., and thereby the reliability of the memory device 20 may be lowered. Therefore, it may be desired and/or necessary to perform a dummy read operation for detecting a level of deterioration of the memory cells, thereby changing the level of the read signal.

In order to correct the voltage level of the read signal, based on and/or depending on the level of deterioration of the memory device, when the dummy signal provided in the dummy read operation is designed to appropriately detect deterioration of an initial memory state at the time of performing the dummy read operation once, there may be a problem in that the deterioration of a latter storage state may not be detected. Further, when it is designed to suitably detect the deterioration of the latter storage state, there may be a problem in that the deterioration of an initial storage state may not be detected.

A memory device according to at least one example embodiment may perform a dummy read operation at least one time, before a read operation of memory cells, to calculate a count value from pieces of dummy data of memory cells that reflect a level of deterioration of memory cells, and may improve a correction coverage of deterioration by changing a level of a read signal according to the counted value, thereby increasing and/or ensuring the reliability of the read operation of the memory device.

Figure 8:
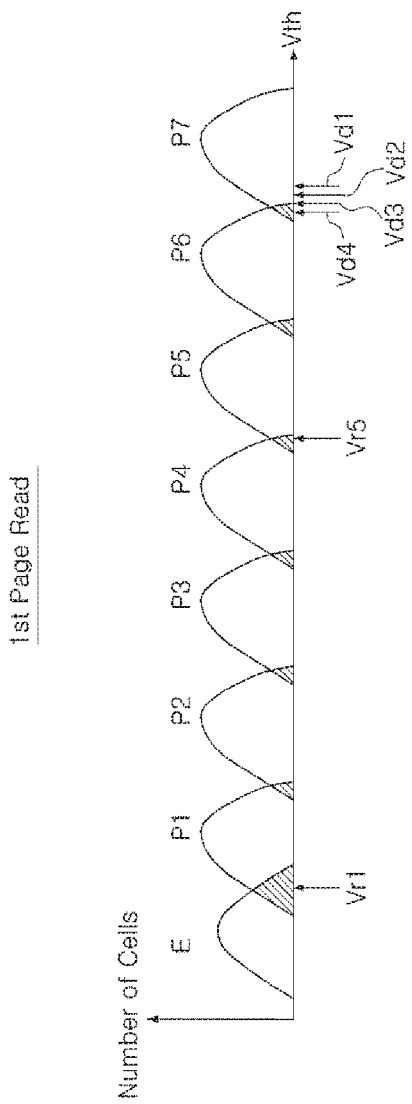
FIG. 8 is a diagram illustrating an example of dummy signals according to at least one example embodiment of the present inventive concepts.

FIG. 8 is a diagram illustrating an example of dummy signals according to at least one example embodiment of the present inventive concepts. In at least one example embodiment, it may be assumed that a plurality of dummy signals are provided in a read (e.g., 1st Page Read) operation of a first bit page corresponding to a least significant bit LSB page, but the example embodiments are not limited thereto.

Referring to FIGS. 2 and 8, a control logic CL may provide a plurality of dummy signals to selected memory cells among the plurality of memory cells. The control logic CL may provide dummy signals in voltage form to the word lines of the memory cells via a voltage generator VG and a row decoder RD according to an externally supplied command CMD and/or address ADD. A level of the dummy signals (e.g., a voltage level of the dummy signals) may have a different level from a level of the read signals (e.g., a voltage level of the read signals). In one example, a plurality of dummy signals may include four dummy signals Vd1 to Vd4, but the example embodiments are not limited thereto.

The control logic CL may provide the dummy signals to the word lines of the memory cells to perform a desired and/or predetermined dummy read operation. For example, the dummy signal according to at least one example embodiment may be understood as a signal for detecting a level of deterioration of memory cells.

Assuming that physical page is composed of three bit pages (e.g., LSB, CSB, MSB), the dummy signals may be provided prior to the read operation of each of the bit pages. For example, in a read (e.g., 1st Page Read) operation of the first bit page, the dummy signals Vd1 to Vd4 may be provided prior to a first read voltage Vr1 and a fifth read voltage Vr5. Also, the dummy signals may be provided prior to the read operation of one physical page, and/or the dummy signals may be provided prior to the read operations of each of the page data of the bit pages. Further, the dummy signals may be provided for each read operation of the memory cells connected to different word lines among the word lines connected to the memory cells.

The dummy signals may have a voltage level corresponding to any one of a plurality of states of the selected memory cells. In one example, the dummy signals may have voltage levels corresponding to a highest state and a lowest state of the memory cells among the plurality of states of the memory cells, etc. Further, referring to FIG. 8, there may be a voltage level corresponding to the seventh program state P7 corresponding to a highest state. In one example, the dummy signals corresponding to a highest state may have a voltage level corresponding to a threshold voltage between a highest state and a previous state of the highest state, specifically, between a highest state and a state immediately below the highest state. The dummy signals corresponding to a lowest state may have a voltage level corresponding to a threshold voltage between a lowest state and the next state of the lowest state, specifically, between a lowest state and a state immediately above the lowest state.

Each of the dummy signals may have a different level (e.g., voltage level). The dummy signals may be provided in the form of a voltage signal, and the interval of each of the voltage levels of each of the dummy signals may be lower than a threshold voltage interval defining a plurality of states of the memory cells, but is not limited thereto. The voltage interval between the dummy signal having the lowest voltage level and the dummy signal having the highest voltage level among the dummy signals may also be lower than the threshold voltage interval defining the plurality of states of the memory cells, but is not limited thereto.

Each of the page buffers of the page buffer unit 22 may store pieces of dummy data of memory cells according to provision of the dummy signals. Specifically, each of the page buffer units may include a plurality of latches, and each of the latches may latch pieces of the dummy data of memory cells according to and/or based on different dummy signals.

The cell counter 23 may count one of on-cells and off-cells of the memory cells from the pieces of dummy data stored in the plurality of latches, and provide the count value of the memory cells to the control logic CL. The control logic CL may correct a level of the read signal, specifically, a voltage level of the read signal, according to the count value, thereby increasing and/or ensuring the reliability of the read operation of the memory device.

On the other hand, depending on the dummy signals having different levels, different dummy voltages may be provided to the word lines of the selected memory cells. In at least one example embodiment, according to the dummy signals having different levels, the same dummy voltage may be applied to the word lines of the selected memory cells, and the latching time of the latches may be varied. Applying the same dummy voltage to the word lines of the memory cells and changing the latching time of the latches may have the same effect as providing different dummy voltages, but is not limited thereto. Next, referring to FIGS. 9 to 11, according to dummy signals having different levels, the same dummy voltage may be applied to word lines of selected memory cells, and a method of varying the latching time of the latches provides the same effect as a method of supplying different voltages will be described in detail.

Figure 9:
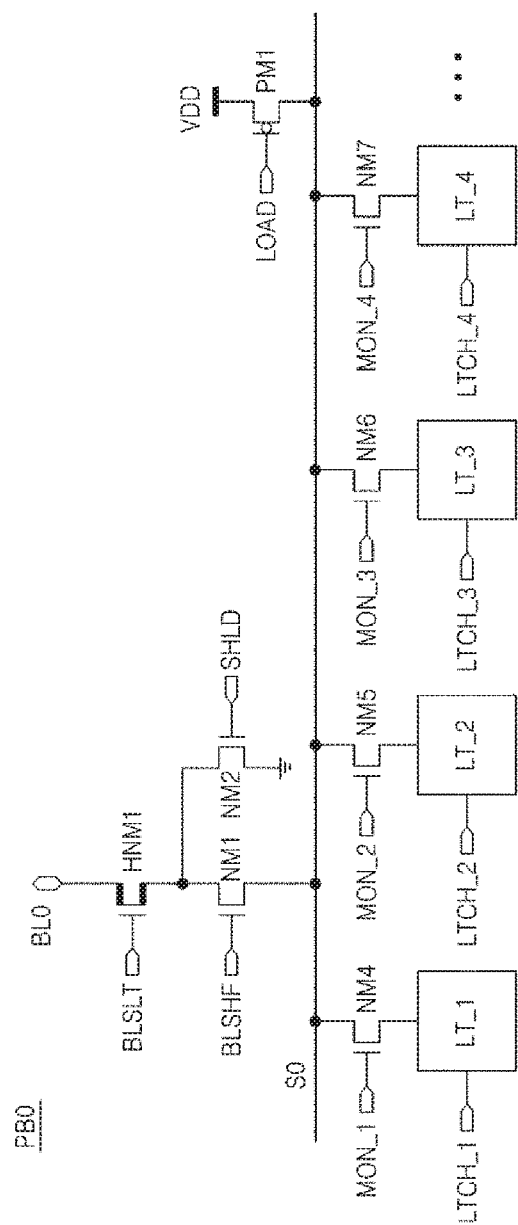
FIG. 9 is a schematic block diagram of a page buffer according to according to at least one example embodiment of the present inventive concepts.

FIG. 9 is a schematic block diagram of a page buffer according to at least one example embodiment of the present inventive concepts. Referring to FIG. 9, a page buffer PB0 may be connected to memory cells of a string STR (e.g., see FIG. 3) connected to a bit line BL0. The page buffer PB0 may include a sensing node SO connected to the bit line BL0. The page buffer PB0 may include a plurality of latches LT_1, LT_2, LT_3, LT_4, etc., respectively connected to the sensing node SO, but is not limited thereto.

During a dummy read operation, the bit line BL0 may be precharged by the control logic. For example, when a load signal LOAD and a bit line selection signal BLSHF are activated, a voltage VBL of a bit line BL may be precharged to a certain and/or desired level. At this time, a high-voltage transistor HNM1 may be kept turned on by a bit line selection signal BLSLT. Subsequently, when the load signal LOAD is deactivated, a charge charged in the sensing node SO may flow to the bit line BL through a transistor NM1 turned on by a control signal BLSHF. For example, a development operation in which a potential change of the sensing node SO occurs may be performed. When the selected memory cell is an on-cell, the charge charged in the sensing node SO may be discharged to the common source line CSL through the channel of the bit line BL0 and the string STR. In this case, since the current flowing from the sensing node SO to the bit line BL0 may be relatively large, the speed of a voltage drop of the sensing node SO may be relatively fast. On the other hand, when the selected memory cell is an off-cell, the charge charged in the sensing node SO may be difficult to discharge to the common source line CSL through the bit line BL. Therefore, since the current flowing from the sensing node SO to the bit line BL may be relatively small, the speed of the voltage drop of the sensing node SO may be relatively slow.

Latch control signals, e.g., LTCH_1, LTCH_2, LTCH_3 and LTCH_4, etc., for controlling the latch timing of the plurality of latches, e.g., LT_1, LT_2, LT_3 and LT_4, etc., may be provided as the latches LT_1, LT_2, LT_3 and LT_4. The latches LT_1, LT_2, LT_3 and LT_4 may latch the developed state of the sensing node SO according to the latch control signals LTCH_1, LTCH_2, LTCH_3 and LTCH_4. The timing of providing the latch control signals LTCH_1, LTCH_2, LTCH_3, and LTCH_4 may be determined according to and/or based on the dummy signals. For example, the latch control signals LTCH_1, LTCH_2, LTCH_3, and LTCH_4 may be sequentially provided to the plurality of latches at different times according to and/or based on the dummy signals having different levels (e.g., different voltage levels).

According to at least one example embodiment, in the dummy read operation, the plurality of latches, e.g., LT_1, LT_2, LT_3, and LT_4, may latch one state of selected memory cells at different times according to the corresponding latch control signals, e.g., LTCH_1, LTCH_2, LTCH_3, LTCH_4. The ON/OFF state of the memory cell selected according to the latch control signals LTCH_1, LTCH_2, LTCH_3, and LTCH_4 may be sequentially stored in the plurality of latches LT_1, LT_2, LT_3, and LT_4, etc.

Figure 10:
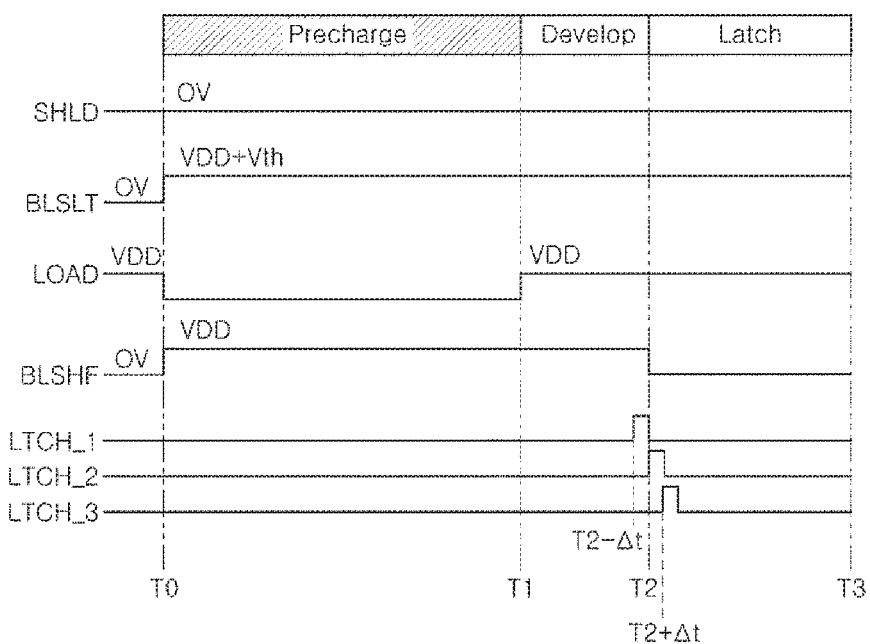
FIG. 10 is a timing diagram illustrating a dummy read operation by a latching signal provided at different times according to at least one example embodiment of the present inventive concepts.

FIG. 10 is a timing diagram illustrating a dummy read operation by a latching signal provided at different times according to at least one example embodiment of the present inventive concepts. Referring to FIGS. 9 and 10, a dummy read operation performed by sensing the sensing nodes a plurality of times at different times (e.g., different time intervals, different points in time, etc.) and storing the sensing data for a plurality of times will be described in detail with reference to at least on example embodiment of the present inventive concepts.

A precharging operation may be performed from time T0 to time T1. Bit line BL0 and a sensing node SO connected to a plurality of page buffers PB0 may be charged for precharging. For example, when control signals BLSHF and BLSLT and a load signal LOAD are activated, the sensing node SO and the bit line BL may be precharged to a specific level, respectively.

At time T1, when the load signal LOAD is deactivated to a high level, a PMOS transistor PM1 may be turned off, and the supply of current from a power source voltage to the sensing node SO may be cut off. As a result, the level of the sensing node SO may change depending on a magnitude of current flowing to the bit line BL, depending on whether the memory cell is on or off. When the selected memory cell is an on-cell, the current flowing to the bit line may be relatively large. Therefore, the level of the sensing node SO may be lowered relatively quickly. On the other hand, when the selected memory cell is an off-cell, the level of the sensing node SO may be maintained at a substantially constant level.

The memory cells distributed around a distribution valley of different program states may be memory cells located at the boundary between an on-cell and an off-cell. Therefore, identification of on-cells or off-cells for these cells may vary depending on the latching time. For example, even when an amount of the latching time is slightly reduced, memory cells distributed around the distribution valley may be identified as an off-cell. On the other hand, even when an amount of the latching time may be slightly increased, memory cells distributed around the distribution valley may be identified as an on-cell. For example, for memory cells having a threshold voltage similar to that of a voltage supplied to a word line, when latching time is advanced, the effect of sensing the word line voltage by increasing the voltage may be provided. On the other hand, for memory cells having a threshold voltage similar to a voltage supplied to a word line, when latching time is delayed, the effect of sensing the dummy voltage may be provided. Accordingly, sensing the sensing node SO a plurality of times by applying the same voltage to the word lines of the selected memory cells and varying the latching time of the latches may precharge and/or sense the bit line by varying the word line voltage.

A latch control signal LTCH_1 may be activated at a time when, for example, it is advanced at a time point to be advanced by Δt on the basis of time T2, but is not limited thereto. For example, the latch control signal LTCH_1 for latching the logical value corresponding to the state of the sensing node SO in a first latch LT_1 may be provided. Then, at time T2, a latch control signal LTCH_2 for latching the state of the sensing node SO in a second latch LT_2 may be provided. A latch control signal LTCH_3 for latching the state of the sensing node SO in the third latch LT_3 may be provided at a time point to be delayed by Δt on the basis of time T2. However, the example embodiments are not limited thereto.

Figure 11:
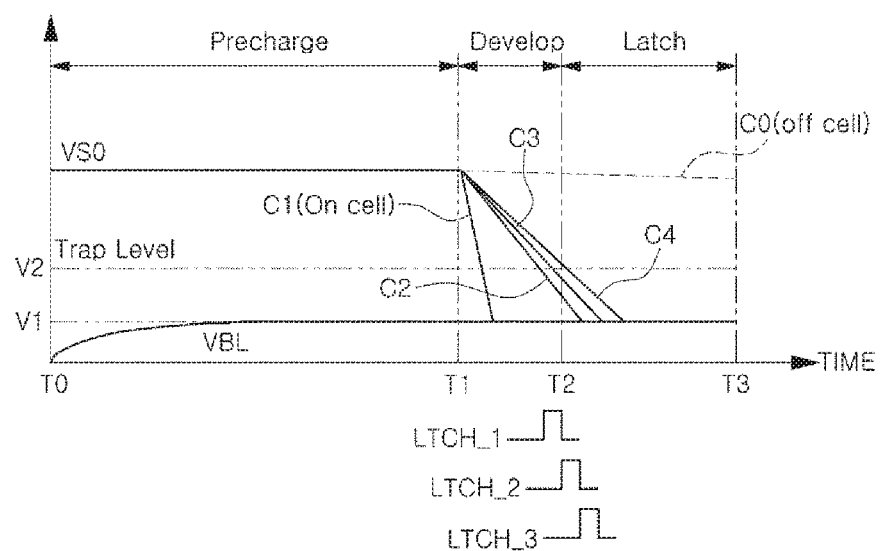
FIG. 11 is a waveform diagram illustrating a change in a level of a sensing node under conditions of control signals of FIG. 10 according to at least one example embodiment.

FIG. 11 is a waveform diagram illustrating a change in a level of a sensing node under conditions of control signals of FIG. 10 according to at least one example embodiment. Referring to FIG. 11, a change in a level of a sensing node SO according to a threshold voltage level of a memory cell and a latch result according to a development time point are briefly shown. A period from time T0 to time T1 may be referred to as a precharging period (e.g., Precharge), a period from time T1 to time T2 may be referred to as a development period (e.g., Develop), and a period after time T2 may be referred to as a latch period (e.g., Latch). On the other hand, as illustrated in FIG. 10, a load signal LOAD may be deactivated in the development period, and a control signal BLSHF may be deactivated in the latch period, etc.

In the precharging period (Precharge), both the load signal LOAD and the control signal BLSHF may be activated to precharge the bit line and the sensing node. In the precharging period (Precharge), a bit line voltage VBL may be charged to a first voltage level V1. In the precharging period (Precharge), the sensing node SO may be charged with a sensing node voltage VSO.

At the time T1 at which the development period (Develop) starts, the load signal LOAD may be deactivated. In this period, the control signal BLSHF may remain active. Accordingly, the charge charged in the sensing node SO may move to the bit line BL according to the threshold voltage state of the memory cell.

In a case of a memory cell (e.g., Strong off cell) in which a threshold voltage is relatively higher than the dummy voltage, a level change of the sensing node SO may be relatively small. A potential change of sensing node SO of the strong off cell in the development period may be shown by a dotted line (e.g., CO). In a case of a memory cell (e.g., Strong on cell) in which a threshold voltage is relatively lower than the dummy voltage, a level change of the sensing node SO may be relatively large. A potential change of sensing node SO of the strong on cell in the development period may be shown by a solid line (e.g., C1). In the case of the strong off cell or the strong on cell, little change in the development time may be not significantly affected.

The potential change of the sensing node SO sensing the memory cells whose threshold voltage is located around the dummy voltage may be illustrated as solid lines, e.g., C2, C3, and C4, respectively. The solid line C2 may show a development tendency of the memory cell having a threshold voltage slightly lower than the dummy voltage. The solid line C3 may show a development tendency of the memory cell having a threshold voltage almost similar to the dummy voltage. The solid line C4 may show a development tendency of the memory cell having a threshold voltage slightly higher than the dummy voltage.

For example, a first latching signal LTCH_1 for latching the sensing node SO of the memory cells may be provided by advancing the latching time point by the reference time based on time T2. When the sensing nodes are latched by the first latching signal LTCH_1, in the case of the strong off cell and the strong on cell, the sensing nodes may be latched by logical values corresponding to an off-cell and an on-cell, respectively. The memory cells corresponding to the solid line C2 having the relatively low threshold voltage may be latched to the logical value corresponding to the on-cell. The memory cells corresponding to the solid lines C3 and C4 may be latched to the logical value corresponding to the off-cell.

When the sensing nodes are latched by a second latching signal LTCH_2, a logical '0' and a logical '1' may be latched in a case of a strong off cell (corresponding to CO) and in a case of a strong on cell (corresponding to C1), respectively, as in the case of the first latching signal LTCH_1. The memory cells having the threshold voltage corresponding to the solid line C2 may be latched to the logical value corresponding to the on-cell. On the other hand, in the case of the memory cell corresponding to the solid line C3, the sensing node SO potential of the trap level V2 may be latched by the second latching signal LTCH_2. For example, the logical '0' and the logical '1' may not be clear. The memory cells corresponding to the solid line C4 may be latched to logical values corresponding to the off-cells.

When the sensing nodes SO are latched by the third latching signal LTCH_3, the logical '0' and the logical '1' may be latched in the cases of the strong off cell CO and the strong on cell C1, respectively, as in the first latching signal LTCH_1. The memory cells having the threshold voltages corresponding to the solid lines C2 and C3 may be all latched to the logical value '1' corresponding to the on-cell, and the memory cell corresponding to the solid line C4, may be latched to a logical value '0' corresponding to the off-cell.

As described above, in the dummy read operation, a method of latching the state of the sensing node SO at different times has been described. An effect similar to those providing a different level of read voltage to the word line substantially at the latching time may be provided. For example, since the dummy signal determines the level of the voltage of the dummy signal and/or the latching time of the latch operation, the dummy signal may be understood as a control signal for determining the level of the voltage of the dummy signal and/or the latching time of the latch operation. According to at least one example embodiment, it may be assumed that the level of the voltage of the dummy signal and/or the timing of the latch operation may be determined according to the level of the dummy signal.

Figure 12:
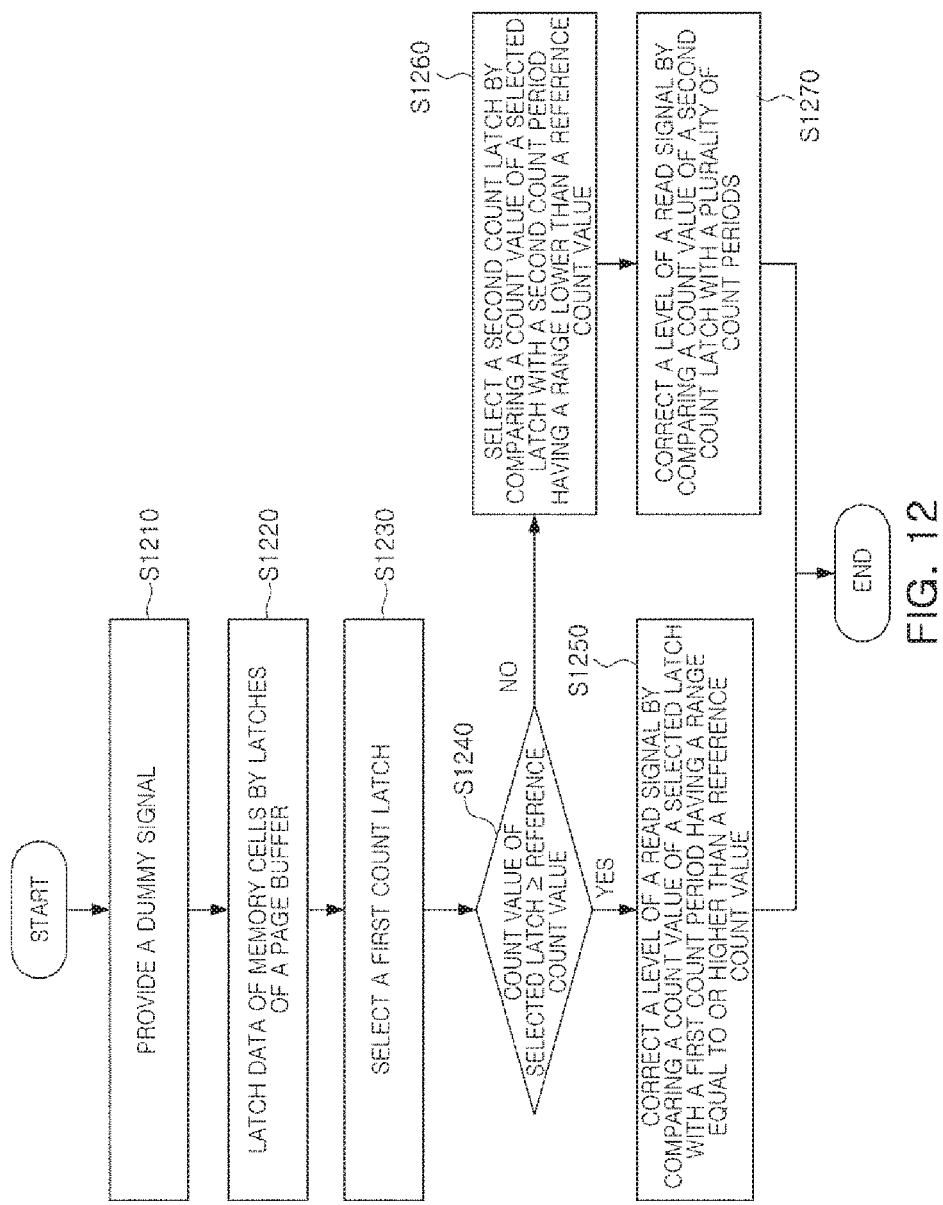
FIG. 12 is a flowchart of a method of correcting deterioration of a memory device according to at least one example embodiment of the present inventive concepts.

FIG. 12 is a flowchart of a method of correcting deterioration of a memory device according to at least one example embodiment of the present inventive concepts.

Referring to FIG. 12, a method of correcting deterioration according to at least one example embodiment may start with providing dummy signals to selected memory cells among a plurality of memory cells (S1210). The plurality of dummy signals may include, for example, first to fourth dummy signals, but is not limited thereto. The first to fourth dummy signals may each have different levels (e.g., voltage levels), and the dummy signals may be provided in the form of a voltage signal. The first to fourth dummy signals may have a voltage level corresponding to any one of a plurality of states of the selected memory cells. In one example, the first to fourth dummy signals may have voltage levels corresponding to a highest state and a lowest state of the plurality of states of the memory cells, and in at least one example embodiment, the first to fourth dummy signals may have a voltage level corresponding to a seventh program state P7, but is not limited thereto.

When the first to fourth dummy signals are provided, the pieces of dummy data of the memory cells corresponding to the first to fourth dummy signals may be latched in (e.g., stored in) latches of a page buffer (S1220). In one example, the page buffer may include first to fourth latches, and each of the first to fourth latches may latch pieces of dummy data of memory cells corresponding to the first to fourth dummy signals accordingly.

When the pieces of dummy data of the memory cells corresponding to the first to fourth dummy signals are latched in the first to fourth latches, a latch to be counted in a high-priority order may be selected (S1230) (e.g., select the priority order for the latches). Referring to FIG. 8, as an example, a latch whose count value may be expected to be the smallest among the first to fourth latches may be selected as a first count latch, but the example embodiments are not limited thereto and any latch may be designated as storing the smallest count value. Specifically, when it is assumed that each of the first to fourth latches latch pieces of dummy data of the seventh program state P7 of the memory cells, and the cell counter counts an off-cell of the seventh program state P7 of the memory cells, according to the first to fourth dummy signals Vd1-Vd4, the count value of the off-cells in the first latch storing the pieces of dummy data of the memory cells according to the first dummy signal Vd1 of the first to fourth latches may be expected to be smaller than the other latches. Therefore, in this case, the first latch may be selected as a first count latch, but the example embodiments are not limited thereto.

The control logic may control the cell counter to count pieces of dummy data of memory cells stored in the selected first count latch, calculate the count value of the first count latch, and compare the count value of the calculated first count latch and a reference count value (S1240).

When the count value of the first count latch is equal to or higher than the reference count value, the control logic may compare the count value of the first count latch with first count periods having a count range, e.g., equal to or higher than, the reference count value. In this case, for example, the first count periods having a count range equal to or higher than the reference count value, may correspond to count periods having a low level of deterioration. In other words, the control logic may determine whether the count value of the first count latch corresponds to count periods having a low level of deterioration based on the count value of the first count latch with the first count periods and a reference count value. Therefore, since a level of deterioration of the count value of the first count latch is relatively low, the control logic may determine a level of the read signal, without selecting the second count latch to be counted subsequent to the first count latch, according to the reference value of the count period corresponding to the count value of the count latch among the first count periods (S1250).

On the other hand, when the count value of the first count latch is, e.g., lower than the reference count value, as a result of the comparison between the count value of the first count latch and the reference count value, the control logic may compare the count value of the first count latch with the second count periods having a count range lower than the reference count value. In this case, the second count periods having a count range lower than the reference count value may correspond to count periods having a high level of deterioration. In other words, the control logic may determine whether the count value of the first count latch corresponds to count periods having a high level of deterioration based on the count value of the first count latch with the second count periods and the reference count value. Therefore, since the level of deterioration of the count value of the first count latch is relatively high, the control logic may need to select the second count latch to be counted subsequent to the first count latch. The control logic may determine a second count latch to be counted in a low-priority order, according to the reference value of the count period corresponding to the first count value among the second count periods (S1260).

The control logic may control the cell counter to count pieces of dummy data of memory cells stored in a second count latch, calculate the count value of the second count latch, and compare the count value of the calculated second count latch and a plurality of count periods. The control logic may correct a level of a read signal according to the reference value of the count period corresponding to the count value of the second count latch among the plurality of count periods (S1270).

First count periods, second count periods, reference values corresponding to them, and correction levels of read signals corresponding to the reference values may be provided in the form of a lookup table. Table 1 below may show first count periods, second count periods, reference values corresponding to them, and Table 2 below may show correction levels of read signals corresponding to the reference values. In Table 1 below, it is assumed that the count value 3000 corresponds to the reference count value, the count periods Case 1 to 3 correspond to the first count periods having a count range equal to or higher than the reference count value, and the count periods Case 4 to 6 correspond to the second count period having a count range lower than the reference count value, but the example embodiments are not limited thereto. The following reference count value and count periods are illustrative, and according to at least one example embodiment, the reference count value and the count periods may be changed.

TABLE 1

|  | Count Value | LT_1 | LT_2 | LT_3 | LT_4 |
|---|---|---|---|---|---|
| Case 1 | 5000 or more | Region 1 | Region 1 | Region 1 | Region 1 |
| Case 2 | 5000~4000 | Region 2 | Region 2 | Region 2 | Region 2 |
| Case 3 | 4000~3000 | Region 3 | Region 3 | Region 3 | Region 3 |
| Case 4 | 3000~2000 | LT_2 Count | Region 4 | Region 4 | Region 4 |
| Case 5 | 2000~1000 | LT_3 Count | Region 5 | Region 5 | Region 5 |
| Case 6 | lower than 1000 | LT_4 Count | Region 6 | Region 6 | Region 6 |

TABLE 2

|  | Region 1 | Region 2 | Region 3 | Region 4 | Region 5 | Region 6 |
|---|---|---|---|---|---|---|
| Vr1 | Vr1_1 | Vr1_2 | Vr1_3 | Vr1_4 | Vr1_5 | Vr1_6 |
| Vr2 | Vr2_1 | Vr2_2 | Vr2_3 | Vr2_4 | Vr2_5 | Vr2_6 |
| Vr3 | Vr3_1 | Vr3_2 | Vr3_3 | Vr3_4 | Vr3_5 | Vr3_6 |
| Vr4 | Vr4_1 | Vr4_2 | Vr4_3 | Vr4_4 | Vr4_5 | Vr4_6 |
| Vr5 | Vr5_1 | Vr5_2 | Vr5_3 | Vr5_4 | Vr5_5 | Vr5_6 |
| Vr6 | Vr6_1 | Vr6_2 | Vr6_3 | Vr6_4 | Vr6_5 | Vr6_6 |
| Vr7 | Vr7_1 | Vr7_2 | Vr7_3 | Vr7_4 | Vr7_5 | Vr7_6 |

Referring to Tables 1 and 2, and when the first latch LT_1 is selected as the first count latch, and the count value of the pieces of dummy data of the first latch LT_1 is 4200, 2, the voltage levels Vr1 to Vr7 of a desired and/or predetermined read signal may be corrected to Vr_2 to Vr7_2.

Further, when the first latch LT_1 is selected as the first count latch, and the count value of the pieces of dummy data of the first latch LT_1 is 1600, the third latch LT_3 may be selected as the second count latch. On the other hand, when the count value of the pieces of dummy data of the third latch LT_3 is 5200, the voltage levels Vr1 to Vr7 of a desired and/or predetermined read signal may be corrected to Vr_1 to Vr7_1 according to the reference value Region 1 of Tables 1 and 2.

Figure 13:
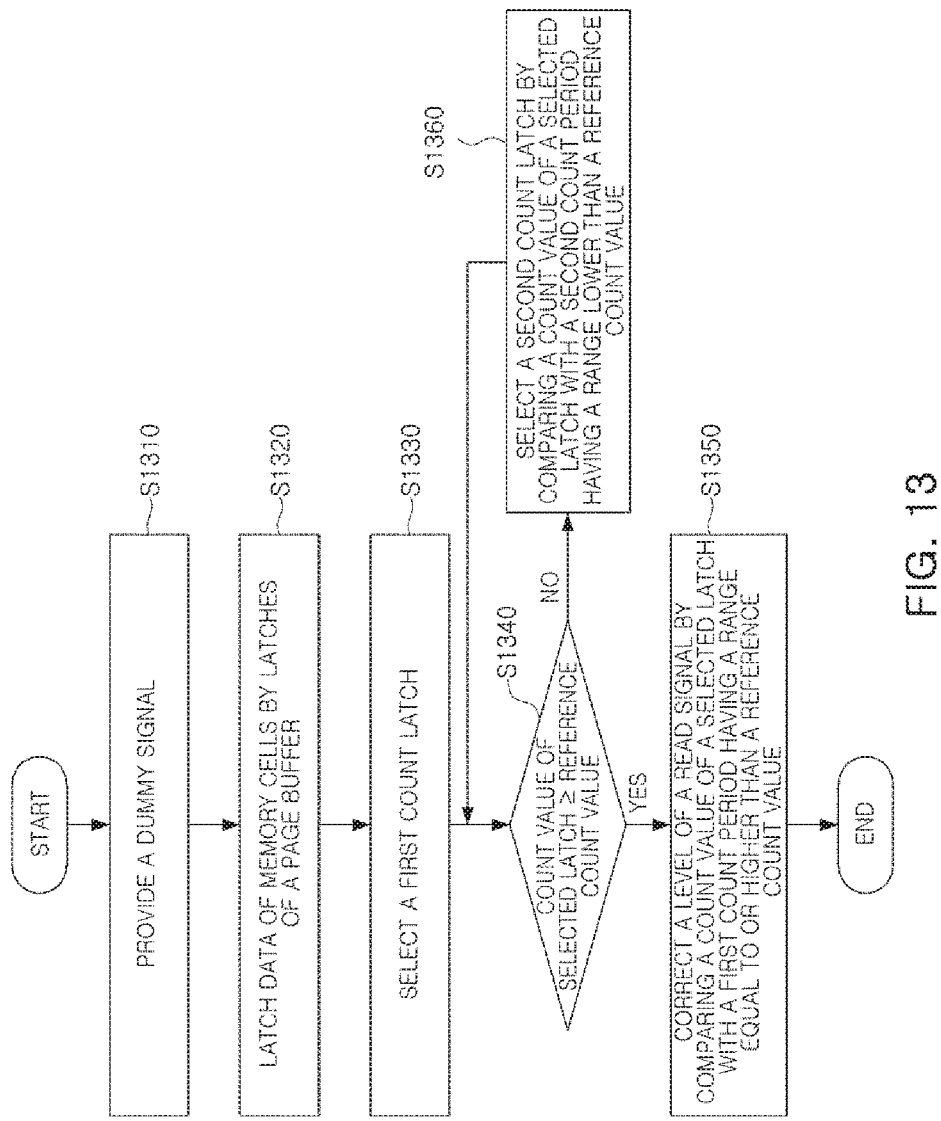
FIG. 13 is a flowchart of a method of correcting deterioration of a memory device according to at least one example embodiment of the present inventive concepts.

FIG. 13 is a flowchart of a method of correcting deterioration of a memory device according to at least one example embodiment of the present inventive concepts. Since at least one example embodiment of FIG. 13 is similar to at least one example embodiment of FIG. 12, overlapped descriptions will be omitted and differences will be mainly described.

Referring to FIG. 13, a method of correcting deterioration according to at least one example embodiment may start with providing dummy signals to selected memory cells among a plurality of memory cells (S1310). The plurality of dummy signals may include, for example, first to fourth dummy signals, but is not limited thereto. The first to fourth dummy signals may have different levels, and the dummy signals may be provided in the form of a voltage signal. The first to fourth dummy signals may have a voltage level corresponding to any one of a plurality of states of the selected memory cells. In one example, the first to fourth dummy signals may have a voltage level corresponding to a highest state and a lowest states of the plurality of states of the memory cells, and in at least one example embodiment, the first to fourth dummy signals may have a voltage level corresponding to a seventh program state P7, but the example embodiments are not limited thereto.

When the first to fourth dummy signals are provided, the pieces of dummy data of the memory cells corresponding to the first to fourth dummy signals may be latched in (e.g., stored in) latches of a page buffer (S1320). In one example, the page buffer may include first to fourth latches, and each of the first to fourth latches may latch pieces of dummy data of memory cells corresponding to the first to fourth dummy signals, etc.

When the pieces of dummy data of the memory cells corresponding to the first to fourth dummy signals are latched in the first to fourth latches, a latch to be counted in a high-priority order may be selected (S1330). Referring to FIG. 8, as an example, a latch whose count value may be expected to be the smallest among the first to fourth latches may be selected as the first count latch, but the example embodiments are not limited thereto. Specifically, when it is assumed that each of the first to fourth latches latch pieces of dummy data of the seventh program state P7 of the memory cells, and the cell counter counts an off-cell of the seventh program state P7 of the memory cells, according to the first to fourth dummy signals Vd1-Vd4, the count value of the off-cells in the first latch storing the pieces of dummy data of the memory cells according to the first dummy signal Vd1 of the first to fourth latches may be expected to be smaller than the other latches. Therefore, in this case, the first latch may be selected as a first count latch.

The control logic may control the cell counter to count pieces of dummy data of memory cells stored in selected first count latch, calculate the count value of the first count latch, and compare the count value of the calculated first count latch and a reference count value (S1340).

When the count value of the first count latch is, for example, equal to or higher than the reference count value, the control logic may compare the count value of the first count latch with first count periods having a count range, e.g., equal to or higher than the reference count value. In this case, the first count periods having a count range equal to or higher than the reference count value may correspond to count periods having a low level of deterioration. In other words, the control logic may determine whether the count value of the first count latch corresponds to count periods having a low level of deterioration based on the count value of the first count latch with the first count periods and a reference count value. Therefore, the control logic may determine a level of the read signal, without selecting the second count latch to be counted subsequent to the first count latch, according to the reference value of the count period corresponding to the count value of the count latch among the first count periods (S1350).

On the other hand, when the count value of the first count latch is, for example, lower than the reference count value as a result of the comparison between the count value of the first count latch and the reference count value, the control logic may compare the count value of the first count latch with the second count periods having a count range, e.g., lower than the reference count value. In this case, the second count periods having a count range lower than the reference count value may correspond to count periods having a high level of deterioration. In other words, the control logic may determine whether the count value of the first count latch corresponds to count periods having a high level of deterioration based on the count value of the first count latch with the second count periods and the reference count value. Therefore, since the level of deterioration of the count value of the first count latch is relatively high, the control logic may need to select the second count latch to be counted subsequent to the first count latch. The control logic may determine a second count latch to be counted in a low-priority order, according to the reference value of the count period corresponding to the first count value among the second count periods (S1360).

When the second count latch to be counted in a low-priority order is selected, the process may proceed to S1340. For example, the first count latch selected as the count target may be updated to the second count latch, and S1340 may be re-executed. Specifically, the control logic may control the cell counter to count pieces of dummy data of memory cells stored in a second count latch, calculate the count value of the second count latch, and compare the count value of the calculated second count latch with the reference count value. On the other hand, since the count value of the first count latch and the count value of the second count latch are different from each other depending on the level interval of the dummy signal, the reference count value corresponding to the first count latch and the reference count value corresponding to the second count latch may be different from each other. For example, the reference count value of the first count latch may be higher than the reference count value of the second count latch. Since the reference count value corresponding to the first count latch and the reference count value corresponding to the second count latch are different from each other, the first count periods and the second count periods determined according to the reference count value may be also different from each other.

When the count value of the second count latch is, for example, equal to or higher than the reference count value as a result of the comparison between the count value of the second count latch and the reference count value corresponding to the second count latch, the control logic may compare the count value of the second count latch with the first count periods having a count range, e.g., equal to or higher than the count value. The control logic may determine the level of the read signal according to the reference value of the count period corresponding to the count value of the second count latch among the first count periods. Additionally, when the count value of the second count latch is lower than the reference count value as a result of the comparison between the count value of the second count latch and the reference count value, the control logic may compare the count value of the second count latch with the first count periods having a count range lower than the count value. The control logic may determine a latch to be counted in a low-priority order, according to the reference value of the count period corresponding to the count value of the second count latch among the second count periods.

First count periods, second count periods, reference values corresponding to them, and/or correction levels of read signals corresponding to the reference values may be provided in the form of a lookup table. As an example, in the following Table 3, in the first latch LT_1, the count value 3000 corresponds to the reference count value, the count periods Case 1 to 3 correspond to the first count periods having a count range equal to or higher than the reference count value, and the count periods Case 4 to 6 correspond to the second count periods having a count range lower than the reference count value. In the second latch LT_2, the count value 2000 corresponds to the reference count value, the count periods Case 1 to 4 correspond to the first count periods having a count range equal to or higher than the reference count value, and the count periods Case 5 to 6 correspond to the second count periods having a count range lower than the reference count value. The following reference count value and count periods are illustrative, and according to at least one example embodiment, the reference count value and the count periods may be changed.

TABLE 3

| | Count Value | LT_1 | LT_2 | LT_3 | LT_4 |
|---|---|---|---|---|---|
| Case 1 | 5000 or more | Region 1 | Region 1 | Region 1 | Region 1 |
| Case 2 | 5000~4000 | Region 2 | Region 2 | Region 2 | Region 2 |
| Case 3 | 4000~3000 | Region 3 | Region 3 | Region 3 | Region 3 |
| Case 4 | 3000~2000 | LT_2 Count | Region 4 | Region 4 | Region 4 |

TABLE 3-continued

| | Count Value | LT_1 | LT_2 | LT_3 | LT_4 |
|---|---|---|---|---|---|
| Case 5 | 2000~1000 | LT_3 Count | LT_3 Count | Region 5 | Region 5 |
| Case 6 | lower than 1000 | LT_4 Count | LT_4 Count | LT_4 Count | Region 6 |

TABLE 4

| | Region 1 | Region 2 | Region 3 | Region 4 | Region 5 | Region 6 |
|---|---|---|---|---|---|---|
| Vr1 | Vr1_1 | Vr1_2 | Vr1_3 | Vr1_4 | Vr1_5 | Vr1_6 |
| Vr2 | Vr2_1 | Vr2_2 | Vr2_3 | Vr2_4 | Vr2_5 | Vr2_6 |
| Vr3 | Vr3_1 | Vr3_2 | Vr3_3 | Vr3_4 | Vr3_5 | Vr3_6 |
| Vr4 | Vr4_1 | Vr4_2 | Vr4_3 | Vr4_4 | Vr4_5 | Vr4_6 |
| Vr5 | Vr5_1 | Vr5_2 | Vr5_3 | Vr5_4 | Vr5_5 | Vr5_6 |
| Vr6 | Vr6_1 | Vr6_2 | Vr6_3 | Vr6_4 | Vr6_5 | Vr6_6 |
| Vr7 | Vr7_1 | Vr7_2 | Vr7_3 | Vr7_4 | Vr7_5 | Vr7_6 |

When the first latch LT_1 is selected as the first count latch and the count value of the pieces of dummy data of the first latch LT_1 is 1600, the third latch LT_3 may be selected as the second count latch. On the other hand, when the count value of the pieces of dummy data of the third latch LT_3 is 1800, the desired and/or predetermined voltage levels Vr1 to Vr7 of the read signal may be corrected to Vr_5 to VT7_5 according to the reference value Region 5 of Tables 1 and 2. On the other hand, when the count value of the pieces of dummy data of the third latch LT_3 is lower than 1000, the fourth latch LT_4 may be selected as the third count latch, and according to the count value of the selected third count latch, the voltage level of the desired and/or predetermined read signal may be corrected.

Figure 14:
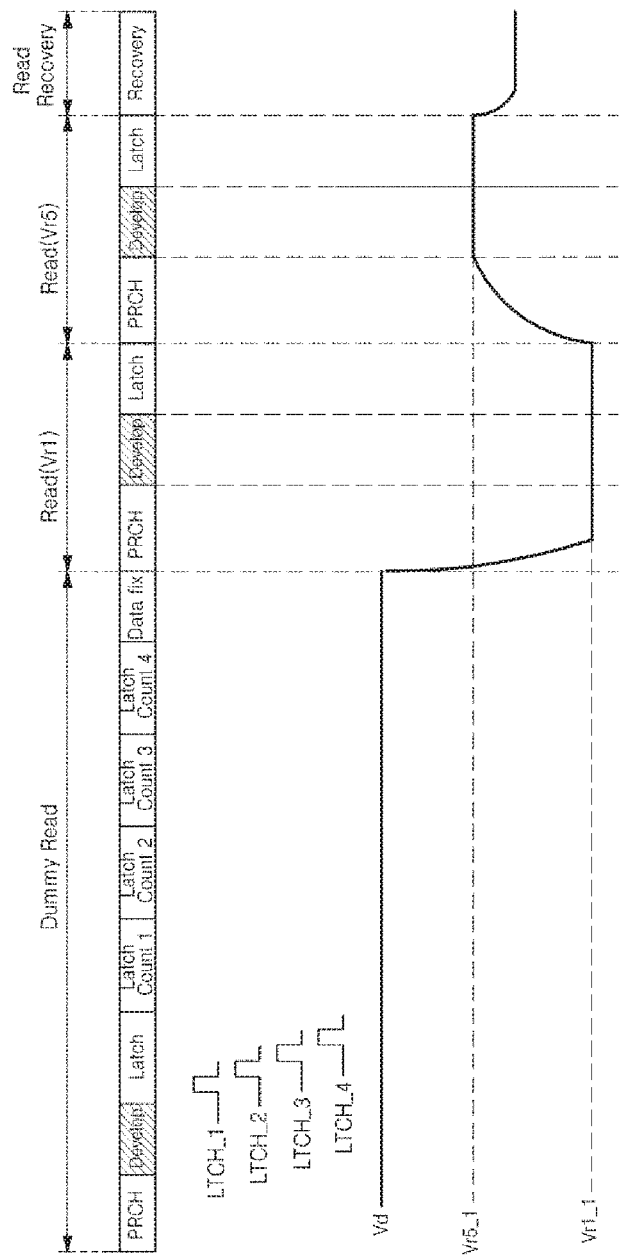
FIG. 14 is a timing diagram illustrating an example in which a dummy read operation and a read operation according to according to at least one example embodiment of the present inventive concepts that are applied to a first bit page (1st page read) corresponding to a least significant bit page of a triple level cell TLC.

FIG. 14 is a timing diagram illustrating an example in which a dummy read operation and a read operation according to some example embodiments of the present inventive concepts are applied to a first bit page (e.g., 1st page read) corresponding to a least significant bit page of a triple level cell TLC.

Referring to FIG. 14, a dummy read (e.g., Dummy Read) operation, a read operation by a first read voltage Vr1, and a read operation by a fifth read voltage Vr5 may be performed to read the first page (e.g., 1st page read) of the triple level cell TLC. Then, a read recovery (e.g., Read Recovery) in which the voltages of the page buffer and the word line are initialized may be performed.

First, for the dummy read (Dummy Read) operation, the bit line and the sensing node SO may be precharged (e.g., PRCH). The word line of the selected memory cell may be provided with a dummy voltage Vd corresponding to the dummy signals. Until the end of the dummy read (Dummy Read) operation, the potential of the word line may be maintained at the level of the dummy voltage Vd. When the precharge corresponding to the dummy signals is completed, a developing (e.g., Develop) operation may be performed in which a potential change of the sensing node SO is generated according to the state of the memory cells. Thereafter, the pieces of dummy data of the selected memory cells may be sequentially latched by the plurality of latches according to the latching signals, e.g., LTCH_1, LTCH_2, LTCH_3, and LTCH_4, provided at different times (e.g., Latch). Thereafter, the pieces of dummy data latched in at least one of the plurality of latches may be counted (e.g., Latch Count 1 to 4), and the correction level of the read signal may be determined, as described in various example embodiments, such as FIGS. 12 and 13. This process is shown as a data fix (e.g., Data fix) in FIG. 14. On the other hand, in FIG. 14, all of the pieces of dummy data latched in the first latch, the second latch, the third latch, and the fourth latch are shown as counts (Latch Counts 1 to 4). FIG. 14 may be illustrative, and pieces of dummy data latched in at least one of the latches may be counted, as described in FIGS. 12 and 13, however the example embodiments are not limited thereto.

In at least one example embodiment, it is assumed that the levels of the first read voltage Vr1 and the fifth read voltage Vr5, as desired and/or predetermined, may be corrected as a result of the dummy operation such that 1_1 read voltage Vr1_1 and 5_1 read voltage Vr5_1 are supplied to the word lines of the selected memory cells, in the read operation by the first read voltage Vr1 and the read operation by the fifth read voltage Vr5.

Then, the bit line and the sensing node SO may be precharged (PRCH) for the read operation by the first read voltage Vr1. The word line of the selected memory cells may be provided with the 1_1 read voltage Vr1_1 in which voltage level is corrected. When the precharge is completed, a developing (Develop) operation in which a potential change of the sensing node SO is generated may be performed, and the state of the memory cells selected by the latching signal LTCH may be latched, according to the state of the memory cell.

Then, the bit line and the sensing node SO are precharged (PRCH) for the read operation by the fifth read voltage Vr5. The word line of the selected memory cells may be provided with 5_1 read voltage Vr5_1. When the precharge is completed, a developing (Develop) operation in which a potential change of the sensing node SO is generated may be performed according to the state of the memory cell, and the state of the memory cells selected by the latching signal LTCH may be latched. The read result of the first bit page (1st page read) against the least significant bit page may be output by processing the read result by the first read voltage Vr1_1 and the read result by the fifth read voltage Vr5_1.

Figure 15:
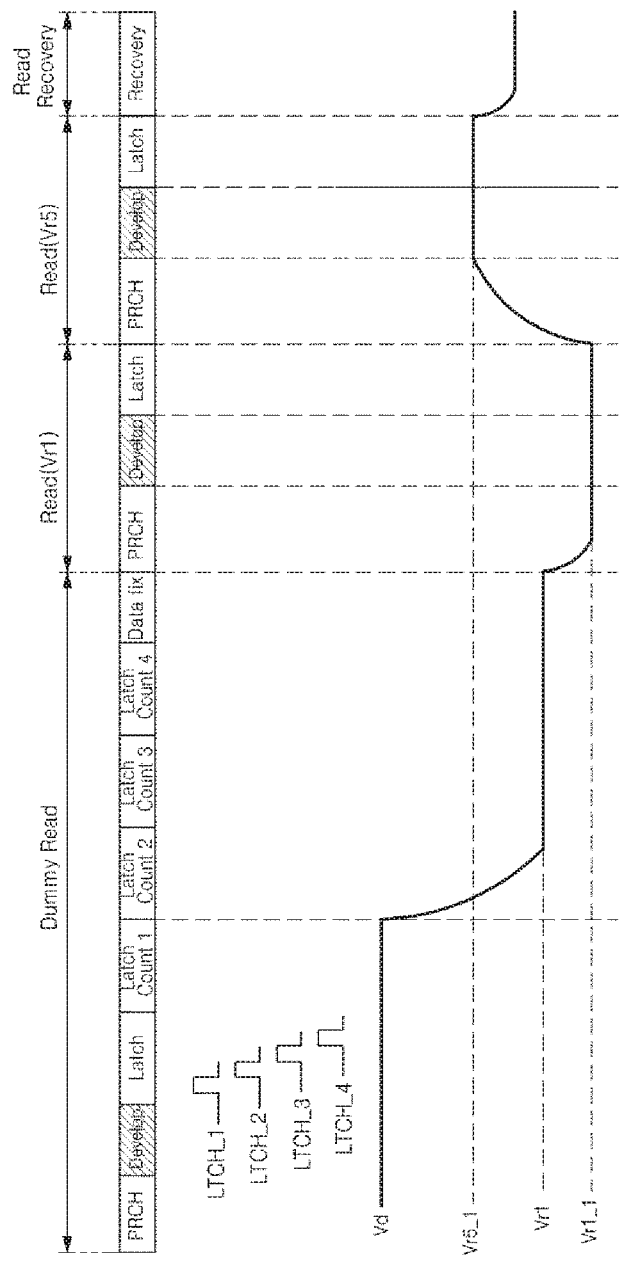
FIGS. 15 and 16 are timing diagram illustrating other examples in which a dummy read operation and a read operation according to according to at least one example embodiment of the present inventive concepts that are applied to a first bit page (1st page read) corresponding to a least significant bit page of a triple level cell TLC.
Figure 16:
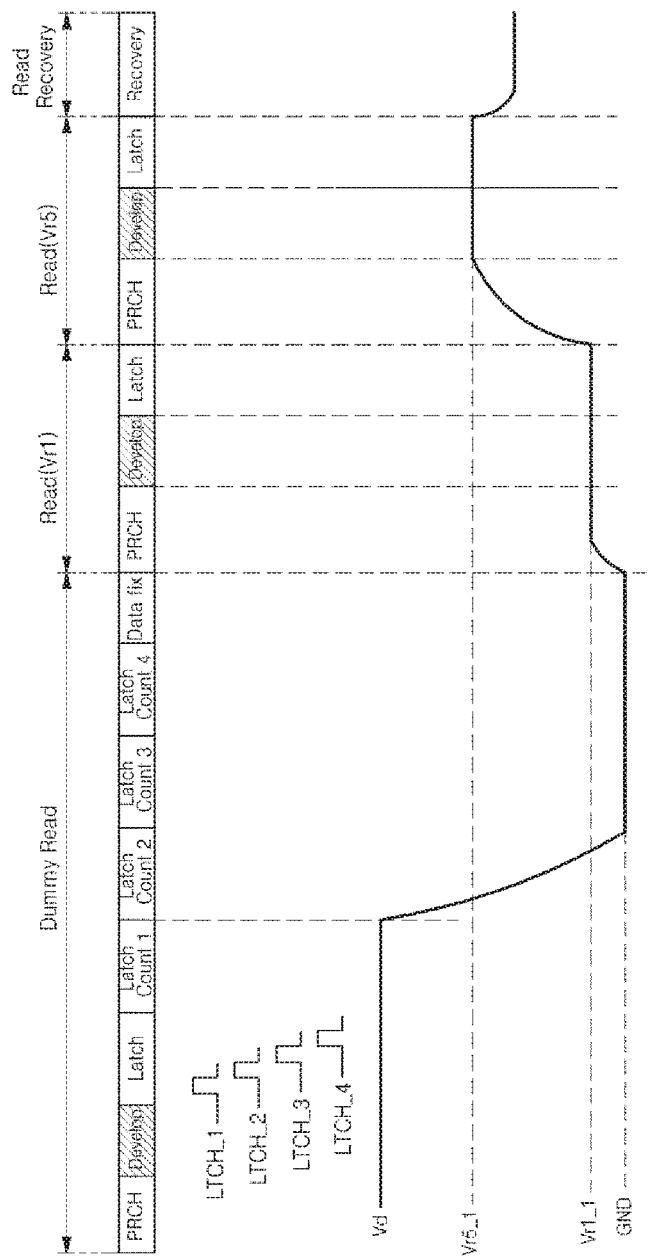

FIGS. 15 and 16 are timing diagram illustrating other examples in which a dummy read operation and a read operation according to some example embodiments of the present inventive concepts are applied to a first bit page (e.g., 1st page read) corresponding to a least significant bit page of a triple level cell TLC, but is not limited thereto.

Referring to FIGS. 15 and 16, for the dummy read (e.g., Dummy Read) operation, the bit line and the sensing node SO may be precharged (e.g., PRCH), and a dummy voltage Vd corresponding to the dummy signals may be provided to the word line of the selected memory cell. In at least one example embodiment of FIG. 14, the potential of the word line may be maintained at the level of the dummy voltage Vd until the end of the dummy read (Dummy Read) operation. On the other hand, in some example embodiments of FIGS. 15 and 16, the potential of the word line may be changed after the end of the latch period in the dummy read (Dummy Read) operation. In one example, the potential of the word line may be changed to a previously set voltage level after the end of the latch operation in the dummy read (Dummy Read) operation. In at least one example embodiment of FIG. 15, the desired and/or predetermined voltage level may correspond to the first read voltage Vr1 corresponding to the voltage level of the read operation subsequent to the dummy read (Dummy Read) operation. In at least one example embodiment of FIG. 16, the desired and/or predetermined voltage level may correspond to the ground (GND) voltage level. Since the level of the desired and/or predetermined first read voltage Vr1 is finally corrected according to the level of deterioration of the memory cells detected during the dummy operation, the level of the desired and/or predetermined first read voltage Vr1 and the level of the corrected first read voltage Vr1 may be partially different.

According to at least one example embodiment, after the end of the latch operation of the dummy read operation, the voltage level of the word line may be changed to a desired and/or predetermined voltage level of the subsequent read operation, or to a ground voltage level having a voltage level slightly different from the desired and/or predetermined voltage level. Time for changing the voltage level of the word line to the voltage level of the subsequent read operation in the subsequent read operation may therefore be reduced. Consequently, the memory device according to at least one example embodiment may reduce the total time required for the read operation.

Figure 17:
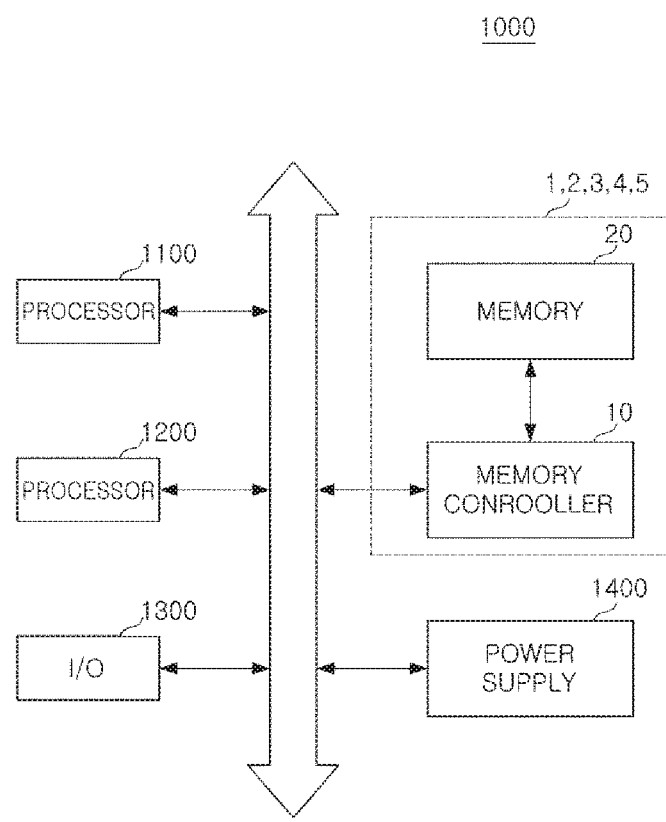
FIG. 17 is a block diagram illustrating a computing system according to at least one example embodiment of the present inventive concepts.

FIG. 17 is a block diagram illustrating a computing system according to at least one example embodiment of the present inventive concepts.

Referring to FIG. 17, a computing system 1000 may include at least one processor 1100, a RAM 1200, an input/output device 1300, a power supply 1400, and/or a memory system 1, but is not limited thereto. Meanwhile, although not illustrated in FIG. 17, the computing system 1000 may further include ports capable of communicating with video cards, sound cards, memory cards, USB devices, and the like, and/or communicating with other electronic devices. The computing system 1000 may be implemented as a personal computer or a portable electronic device such as a notebook computer, a mobile phone, a personal digital assistant (PDA), a camera, and the like. The at least one processor 1100 may perform certain calculations or tasks. According to at least one example embodiment, the processor 1100 may be a micro-processor, a Central Processing Unit (CPU), etc. The processor 1100 may communicate with the RAM 1200, the input/output device 1300, and/or the memory system 1 via a bus 1500, such as an address bus, a control bus, and a data bus. According to at least one example embodiment, the processor 1100 may also be connected to an expansion bus, such as a Peripheral Component Interconnect (PCI) bus, etc. The RAM 1200 may store data necessary for operation of the computing system 1000. For example, the RAM 1200 may be implemented as a DRAM, a mobile DRAM, an SRAM, a PRAM, an FRAM, an RRAM, and/or an MRAM, etc. The input/output device 1300 may include input means such as a keyboard, a keypad, a mouse and the like, and output means such as a printer, a display, and the like. Power supply 1400 may supply the operating voltage required for operation of computing system 1000. Although not shown, the memory system 1 according to at least one example embodiment may be used for storing information processing devices capable of exchanging a large amount of data in combination with an application chipset, a camera image processor, a mobile DRAM, Device, etc. The memory devices 20A, 20B and the memory systems 1, 2 according to some example embodiments may be implemented using various types of packages. For example, the memory devices 20A and 20B and the memory systems 1 and 2 may be mounted using packages such as a Package on Package (PoP), Ball grid arrays (BGAs), Chip scale packages (CSPs), a Plastic Leaded Chip Carrier (PLCC), a Plastic Dual In-Line Package (PDIP), a Die in Waffle Pack, a Die in Wafer Form, a Chip On Board (COB), a Ceramic Dual In-Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a Thin Quad Flatpack (TQFP), a System In Package (SIP), a Multi Chip Package (MCP), a Wafer-level Fabricated Package (WFP), a Wafer-Level Processed Stack Package (WSP), and the like.

The memory device according to at least one example embodiment of the present inventive concepts may improve the correction coverage while reducing the number of counts of the plurality of pieces of dummy data latched by the dummy read operation, and reduce the total time required for the read operation.

While various example embodiments have been shown and described above, it will be apparent to those skilled in the art that modifications and variations could be made without departing from the scope of the present inventive concepts as defined by the appended claims.

What is claimed is:

1. A memory device comprising:
a page buffer unit including a plurality of latches, the plurality of latches configured to latch a plurality of pieces of dummy data of selected memory cells based on a plurality of dummy signals provided by a word line of the selected memory cells, the plurality of latches including a first count latch and a second count latch, the first count latch and the second count latch each configured to store a value corresponding to a number of on-cells or off-cells of respective ones of the selected memory cells; and
a control logic configured to,
determine whether to count the values of the second count latch based on a count value of the first count latch and a reference count value, and
correct a voltage level of a read signal provided by the word line of the selected memory cells in a read operation based on results of the determination.

2. The memory device according to claim 1, wherein the plurality of dummy signals have different voltage levels.

3. The memory device according to claim 2, wherein the plurality of dummy signals have voltage levels corresponding to any one of a plurality of program states of the memory cells.

4. The memory device according to claim 1, wherein the control logic is further configured to determine whether the count value of the first count latch is lower than a count value of the remaining latches of the plurality of latches.

5. The memory device according to claim 1, wherein the control logic is further configured to compare the count value of the first count latch with a plurality of first count periods having a count range equal to or higher than the reference count value, in response to the count value of the first count latch being equal to or higher than the reference count value.

6. The memory device according to claim 5, wherein the control logic is further configured to correct a voltage level of the read signal based on a reference value of a count period corresponding to the count value of the first count latch from among the plurality of first count periods.

7. The memory device according to claim 5, wherein the control logic is further configured to compare the count value of the first count latch with a plurality of second count periods having a count range lower than the reference count value, in response to the count value of the first count latch being lower than the reference count value.

8. The memory device according to claim 7, wherein the control logic is further configured to select the second count latch based on a reference value of a count period corresponding to the count value of the first count latch among the plurality of second count periods.

9. The memory device according to claim 8, wherein the control logic is further configured to correct a voltage level of the read signal based on a reference value of a count period corresponding to the count value of the second count latch among the plurality of first count periods, and the plurality of second count periods.

10. A memory device comprising:
a page buffer unit including a plurality of latches configured to latch a plurality of pieces of dummy data of selected memory cells based on a plurality of dummy signals provided by a word line of the selected memory cells;
a cell counter connected to the plurality of latches, the cell counter configured to count at least one of the pieces of dummy data;
a control logic configured to detect a level of deterioration of the selected memory cells to correct a voltage level of a read signal, based on at least one count value output from the cell counter; and
the cell counter is further configured to determine whether to update a piece of the dummy data selected as a count target, based on a level of deterioration of the pieces of dummy data selected as a count target.

11. The memory device according to claim 10, wherein the plurality of dummy signals have a voltage level corresponding to a lowest program state or a highest program state of the memory cells.

12. The memory device according to claim 10, wherein the control logic is further configured to determine whether a count value of the pieces of dummy data selected as the count target among the plurality of pieces of dummy data is lower than a count value of remaining pieces of the dummy data.

13. The memory device according to claim 10, wherein the control logic is further configured to:
compare a count value of the pieces of the dummy data selected as the count target having a count range equal to or higher than a reference count value with first count periods, in response to the count value of the pieces of the dummy data selected as the count target being equal to or higher than the reference count value; and
correct the voltage level of the read signal based on a reference value of a count period corresponding to the count value of the pieces of dummy data selected as the count target.

14. The memory device according to claim 10, wherein the control logic is further configured to compare a count value of the pieces of dummy data selected as the count target with second count periods having a count range lower than a reference count value, in response to the count value of the pieces of dummy data selected as the count target being lower than the reference count value.

15. The memory device according to claim 14, wherein the control logic is further configured to update the pieces of dummy data selected as the count target, based on a reference value of the count period corresponding to the count value of the pieces of dummy data selected as the count target among the second count periods.

16. The memory device according to claim 15, wherein the control logic is further configured to determine whether the reference count value corresponding to the pieces of dummy data selected as the count target before the updating of the count target is higher than the reference count value of the pieces of dummy data selected as the count target after the updating of the count target.

17. A memory device performing a dummy read operation to provide a dummy voltage to a word line of selected memory cells, prior to a read operation providing a read voltage to the word line of the selected memory cells, the memory device comprising:
- a page buffer connected to a memory cell array including a plurality of memory cells, and the page buffer including a plurality of latches;
- a cell counter connected to the plurality of latches, the cell counter configured to count at least one of an on-cell or an off-cell of the memory cells; and
- a control logic configured to,
- correct a voltage level of a read signal based on a count value output from the cell counter, in response to the dummy voltage, and
- change a potential of the word line to a desired voltage level of the read signal, after an end of a latch period corresponding to the plurality of latches latching data of the memory cells during the dummy read operation.

18. The memory device according to claim 17, wherein the control logic is further configured to change the potential of the word line at the end of the latch period to the desired voltage level of the read signal.

19. The memory device according to claim 17, wherein control logic is further configured to change the potential of the word line at a start of the read operation to the desired voltage level of the read signal.

20. The memory device according to claim 17, wherein the plurality of latches are configured to latch pieces of dummy data of the memory cells at different times, while the dummy voltage is provided to the word line.

* * * * *